United States Patent
Thanu et al.

(10) Patent No.: US 11,358,809 B1
(45) Date of Patent: Jun. 14, 2022

(54) VACUUM ROBOT APPARATUS FOR VARIABLE PITCH ACCESS

(71) Applicant: APPLIED MATERIALS, INC., Santa Clara, CA (US)

(72) Inventors: Rajkumar Thanu, Santa Clara, CA (US); Jeffrey C. Hudgens, San Francisco, CA (US); Karuppasamy Muthukamatchi, Madurai (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/188,374

(22) Filed: Mar. 1, 2021

(51) Int. Cl.
*H01L 21/677* (2006.01)
*B65G 47/91* (2006.01)
*H01L 21/687* (2006.01)

(52) U.S. Cl.
CPC ........ *B65G 47/91* (2013.01); *H01L 21/67745* (2013.01); *H01L 21/68707* (2013.01)

(58) Field of Classification Search
None
See application file for complete search history.

(56) References Cited

U.S. PATENT DOCUMENTS

| 6,893,204 B1* | 5/2005 | Suzuki | B65G 49/067 |
| | | | 414/744.5 |
| 8,888,435 B2* | 11/2014 | Yazawa | B25J 9/043 |
| | | | 414/744.5 |
| 11,031,269 B2* | 6/2021 | Matsuoka | H01L 21/67766 |
| 2009/0084215 A1* | 4/2009 | Yazawa | B25J 15/0052 |
| | | | 74/490.01 |
| 2020/0384634 A1 | 12/2020 | Muthukamatchy et al. | |
| 2020/0384636 A1 | 12/2020 | Muthukamatchy | |

FOREIGN PATENT DOCUMENTS

JP  2008135630 A  *  6/2008

\* cited by examiner

*Primary Examiner* — Gerald McClain
(74) *Attorney, Agent, or Firm* — Lowenstein Sandler LLP

(57) ABSTRACT

Methods, systems, and devices including a robot apparatus with at least one lower arm configured to rotate about a first rotational axis and at least one upper arm rotatably coupled to the at least one lower arm at a second rotational axis that is spaced away from the first rotational axis. The robot apparatus further include a first end effector coupled to the upper arm. The robot apparatus further includes a second end effector coupled to the at least one upper arm. The robot apparatus is suitable for accommodating varying pitches between two adjacent processing chambers or between two adjacent load lock chambers. The robot apparatus may operate in dual substrate handling mode, single substrate handling mode, or a combination thereof. The robot apparatus may also be an off-axis robot.

18 Claims, 22 Drawing Sheets

VACUUM ROBOT APPARATUS FOR VARIABLE PITCH ACCESS

FIELD

Embodiments of the present application relate to robots including multiple end effectors and electronic device processing devices and methods including robots with multiple end effectors.

BACKGROUND

Processing of substrates in semiconductor electronic device manufacturing may include a combination of different processes applied in the same substrate processing system. For example, the processes may include chemical vapor deposition/atomic layer deposition (CVD/ALD) and physical vapor deposition (PVD) applied within the same tool or platform. These processes may be applied using different configurations of processing chambers coupled to a main frame. Robots are located in a transfer chamber of the main frame and are configured to move substrates between the various processing chambers.

SUMMARY

In some embodiments, a robot apparatus is provided. The robot apparatus includes at least one lower arm configured to rotate about a first rotational axis; at least one upper arm rotatably coupled to the at least one lower arm at a second rotational axis that is spaced away from the first rotational axis; a first end effector rotatably coupled to the at least one upper arm optionally through a first forearm; and a second end effector rotatably coupled to the at least one upper arm optionally through a second forearm. In embodiments, the robot apparatus is configured to operate both in a dual substrate handling mode and in a single substrate handling mode. In the dual substrate handling mode, the first end effector and the second end effector are to independently rotate about one or more additional rotational axis that are different from the first rotational axis and from the second rotational axis to space the first end effector from the second end effector by a first pitch or by a second pitch that is different from the first pitch, wherein at least one of the first pitch or the second pitch is suitable for the first end effector and the second end effector to concurrently access separate load lock chambers or separate process chambers. In the single substrate handling mode, the first end effector and the second end effector are to independently rotate about the one or more additional rotational axis to align the first end effector and the second end effector at a configuration suitable for one of the first end effector or the second end effector to access one load lock chamber or one process chamber.

In other embodiments, an electronic device processing system is provided. The electronic device processing system includes a transfer chamber; two adjacent load lock chambers coupled to the transfer chamber, wherein the two adjacent load lock chambers are horizontally spaced by a first pitch; four or more process chambers coupled to the transfer chamber, wherein at least one pair of adjacent process chambers of the four or more process chambers are spaced by a second pitch that is different from the first pitch; and a robot apparatus at least partially located within the transfer chamber. In embodiments, the robot apparatus includes at least one lower arm configured to rotate about a first rotational axis; at least one upper arm rotatably coupled to the at least one lower arm at a second rotational axis that is spaced away from the first rotational axis; a first end effector rotatably coupled to the at least one upper arm optionally through a first forearm; and a second end effector rotatably coupled to the at least one upper arm optionally through a second forearm. In embodiments, the robot apparatus is configured to operate both in a dual substrate handling mode and in a single substrate handling mode. In the dual substrate handling mode, the first end effector and the second end effector are to independently rotate about one or more additional rotational axis that are different from the first rotational axis and from the second rotational axis to space the first end effector from the second end effector by the first pitch or by the second pitch that is different from the first pitch to enable the first end effector and the second end effector to concurrently access the two adjacent load lock chambers or the at least one pair of adjacent process chambers. In the single substrate handling mode, the first end effector and the second end effector are to independently rotate about the one or more additional rotational axis to align the first end effector and the second end effector at a configuration suitable for one of the first end effector or the second end effector to access one load lock chamber or one process chamber.

In other embodiments, a method of transferring substrates is provided. The method includes operating a robot apparatus in a dual substrate handling mode and in a single substrate handling mode. In embodiments, the robot apparatus includes at least one lower arm configured to rotate about a first rotational axis; at least one upper arm rotatably coupled to the at least one lower arm at a second rotational axis that is spaced away from the first rotational axis; a first end effector rotatably coupled to the at least one upper arm optionally through a first forearm; and a second end effector rotatably coupled to the at least one upper arm optionally through a second forearm. In embodiments, operating in a dual substrate handling mode includes independently rotating the first end effector and the second end effector, about one or more additional rotational axis that are different from the first rotational axis and from the second rotational axis, to space the first end effector from the second effector by a first pitch or by a second pitch that is different from the first pitch, wherein at least one of the first pitch or the second pitch is suitable for the first end effector and the second end effector to concurrently access separate load lock chambers or separate process chambers. In embodiments, operating in a single substrate handling mode includes independently rotating the first end effector and the second end effector, about the one or more additional rotational axis, to align the first end effector and the second end effector in a configuration suitable for one of the first end effector or the second end effector to access one load lock chamber or one process chamber.

In other embodiments, an electronic device processing system is provided. The electronic device processing system includes The electronic device processing system includes a transfer chamber with a center; two adjacent loadlock chambers coupled to the transfer chamber, wherein the two adjacent loadlock chambers are horizontally spaced by a first pitch; four or more process chambers coupled to the transfer chamber, wherein at least one pair of adjacent process chambers of the four or more process chambers are spaced by a second pitch that is different from the first pitch; and a robot apparatus at least partially located within the transfer chamber. In embodiments, the robot apparatus includes at least one lower arm configured to rotate about a first rotational axis, wherein the first rotational axis is offset from the center of the transfer chamber; at least one upper arm rotatably coupled to the at least one lower arm at a second rotational axis that is spaced away from the first rotational axis; a first end effector rotatably coupled to the at least one upper arm optionally through a first forearm; and a second end effector rotatably coupled to the at least one upper arm optionally through a second forearm. In embodiments, the robot apparatus is configured to operate in a dual substrate handling mode. In the dual substrate handling mode, the first end effector and the second end effector are to independently rotate about one or more additional rotational axis that are different from the first rotational axis and from the second rotational axis to space the first end effector from the second end effector by the first pitch or by the second pitch that is different from the first pitch to enable the first end effector and the second end effector to concurrently access the two adjacent load lock chambers or the at least one pair of adjacent process chambers.

Numerous other aspects and features are provided in accordance with these and other embodiments of the disclosure. Other features and aspects of embodiments of the disclosure will become more fully apparent from the following detailed description, the claims, and the accompanying drawings.

BRIEF DESCRIPTION OF DRAWINGS

The drawings, described below, are for illustrative purposes only and are not necessarily drawn to scale. The drawings are not intended to limit the scope of the disclosure in any way. Wherever possible, the same or like reference numbers will be used throughout the drawings to refer to the same or like parts.

DETAILED DESCRIPTION

Figure 1:
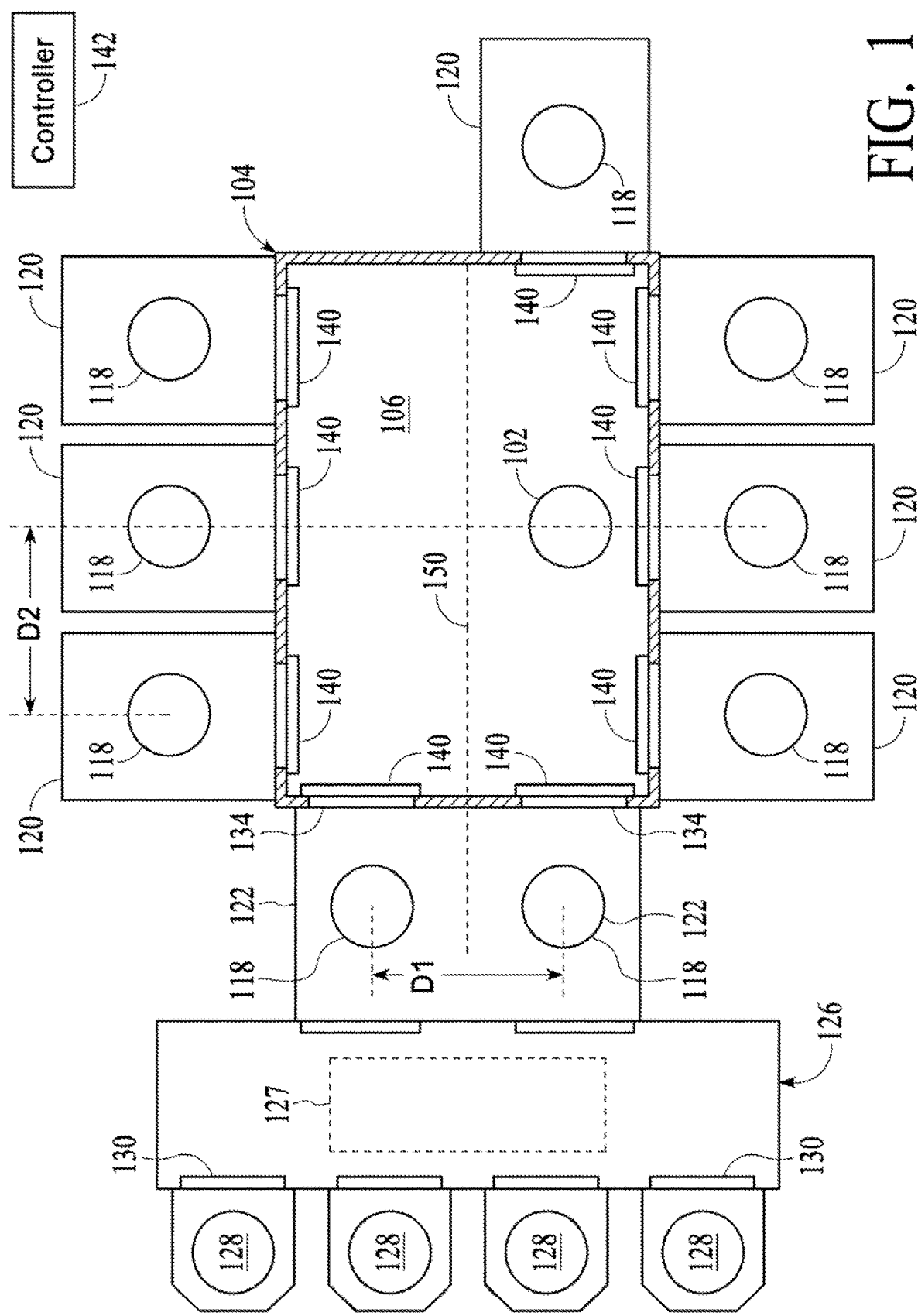
FIG. 1 illustrates a schematic top view of a substrate processing system including a robot apparatus located in a transfer chamber of a main frame according to the disclosed embodiments.

Reference will now be made in detail to the example embodiments provided, which are illustrated in the accompanying drawings. Features of the various embodiments described herein may be combined with each other unless specifically noted otherwise.

Electronic device processing systems may implement a combination of multiple substrate manufacturing processes. These substrate manufacturing processes may include chemical vapor deposition/atomic layer deposition (CVD/ALD) processes, annealing processes, etch processes, physical vapor deposition (PVD) and/or other processes. The electronic device processing systems may include a variety of different process chambers and load lock chambers to implement the combination of multiple substrate manufacturing processes. These process chambers and load lock chambers may each include one or more processing locations on which substrates are positioned for processing. Processing locations in different process chambers and/or load lock chambers may be separated by different distances (e.g., pitches) depending on a physical arrangement or process chambers, the type of manufacturing process to be implemented within each process chamber and/or the configuration of the process chambers.

In embodiments, a transfer chamber includes multiple load locks and/or multiple process chambers connected to sides or facets of the transfer chamber. The transfer chamber may include a robot arm with dual end effectors for transferring substrates between load locks and/or transfer chambers. The robot may by designed such that a pitch or separation between the dual end effectors is adjustable, and may be further designed such that the end effectors may be positioned both for single substrate handling (in which a single substrate is removed from and/or inserted into a process chamber or load lock) and may further be positioned for multiple substrate handling (in which two substrates are removed from and/or inserted into a process chamber or load lock).

Existing robot apparatuses, e.g., robot apparatuses with an inline end effector, access one process chamber and/or one load lock chamber at a time and exhibit throughputs ranging from about 60 wafers per hour (WPH) to about 80 WPH. Thus, in accordance with embodiments described herein, a robot apparatus with enhanced throughput is provided. In certain embodiments, the robot apparatus described herein exhibits a throughput of at least about 100 WPH and in certain embodiments even greater than 175 WPH.

A robot apparatus with dual end effectors may be implemented to position substrates on and to remove substrates from multiple processing chambers (e.g., side-by-side process chambers) simultaneously. However, dual end effectors positioned at a first fixed pitch may not be able to access one or more process chambers or one or more load lock chambers due to the process chambers or load lock chambers being separated by a second fixed pitch that is different from the first fixed pitch. Thus, in accordance with embodiments described herein, a robot apparatus with variable end effector pitch is provided.

The robot apparatuses described herein can operate in a single substrate processing mode, a dual substrate processing mode, or a combination thereof. This added flexibility and independent access capability permits sequential loading and unloading of various processing chambers or load lock chambers. This hybrid capability also allows the robot apparatus to continue operating even when one processing chamber or load lock chamber out of a pair of adjacent processing chambers or load lock chambers is inoperative.

In one or more embodiments described herein, a robot apparatus configured to operate in a single substrate mode, dual substrate mode, or a combination thereof is disclosed. The robot apparatus, when operating in a dual substrate mode, can have a variable end effector pitch to accommodate varying pitches, e.g., between two adjacent processing chambers or between two adjacent load lock chambers. In certain embodiments, the robot apparatus is an off-center (also referred to as an off-axis) robot that is positioned off-center from a center of the transfer chamber in which it is located.

Example embodiments of robots including different pitches between end effectors are described herein with reference to FIGS. 1-9.

Reference is now made to FIG. 1, which illustrates a schematic top view of a substrate processing system 100 including a robot apparatus 102 according to disclosed embodiments. The substrate processing system 100 may include a main frame 104 including a transfer chamber 106 formed by walls thereof. The transfer chamber 106 may be configured to operate in a vacuum, for example. The transfer chamber may have a center 150. The robot apparatus 102 may be at least partially located in the transfer chamber 106 and may be configured to be operable therein. The robot apparatus 102 may include a body (214 in FIG. 2, 514 in FIG. 5, and 814 in FIG. 8A) that is configured to be attached to a wall (e.g., the floor) of the transfer chamber 106. The robot apparatus 102 may be "off axis" or "off center," which as used herein, refers to the robot apparatus having at least one lower arm configured to rotate about a first rotational axis that is offset from the center 150 of the transfer chamber 106.

The robot apparatus 102 may be configured to pick and/or place substrates 118 (sometimes referred to as a "wafers" or "semiconductor wafers") to and from different destinations. The destinations may be process chambers coupled to the transfer chamber 106. The destinations may also be load lock chambers coupled to transfer chamber 106. For example, the destinations may be one or more process chambers 120 and one or more load lock chambers 122 that may be coupled to transfer chamber 106. The main frame 104 may include more or fewer process chambers 120 than illustrated in FIG. 1 and more or fewer load lock apparatus 122 than illustrated in FIG. 1.

Figure 9:
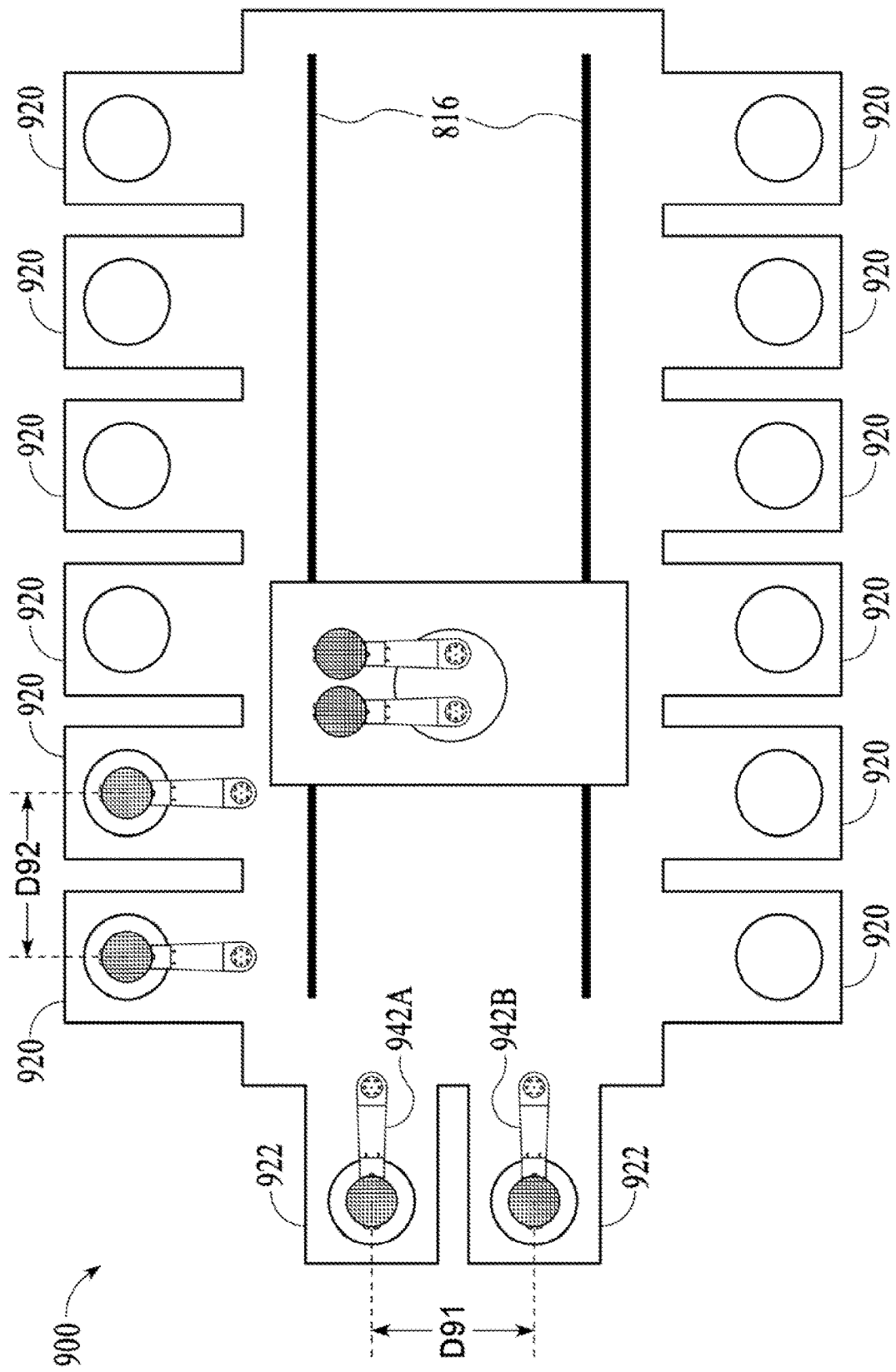
FIG. 9 illustrates a schematic top view of a substrate processing system including the robot apparatus of FIGS. 8A-8C located in a transfer chamber of a main frame according to the disclosed embodiments.

The process chambers 120 may be configured to carry out any number of process steps on the substrates 118, such as deposition, oxidation, nitration, etching, polishing, cleaning, lithography, or the like. In FIG. 1, seven process chambers 120 are shown coupled to various sides of transfer chamber 106. However, it should be noted that other configurations that include more or fewer process chambers are also feasible and contemplated by the instant disclosure. In certain embodiments, the number of process chambers coupled to the transfer chamber 106 ranges from 4 to 24. In certain embodiments, the number of process chambers coupled to the transfer chamber 106 ranges from 4 to 20. In certain embodiments, the number of process chambers coupled to the transfer chamber 106 ranges from 5 to 16. In certain embodiments, the number of process chambers coupled to the transfer chamber 106 ranges from 6 to 10. FIG. 9 depicts an example with of an electronic device processing system with 12 process chambers. In some embodiments, the transfer chamber is a linear transfer chamber having two longer sides and two shorter sides. In other embodiments, the transfer chamber may have more than four sides, such as five sides, six sides, seven sides, eight sides, and so on. The multiple sides may have a same size (e.g., a same length) and/or different sizes.

The load lock chambers 122 may be configured to interface with a factory interface 126. The factory interface 126 may include a load/unload robot 127 (shown as a dotted box) configured to transport substrates 118 to and from substrate carriers 128 (e.g., Front Opening Unified Pods (FOUPs)) docked at load ports 130 of the factory interface 126. Another load/unload robot may transfer the substrates 118 between the substrate carriers 128 and the load lock chambers 122 in any sequence or order.

In some embodiments, two adjacent load lock chambers 122 are horizontally spaced by a first pitch D1. In some embodiments, the first pitch D1 between centers of the two adjacent load lock chambers 122 may be in a range of about 20 inches to about 25 inches. In some embodiments, the first pitch D1 between centers of two adjacent load lock chambers 122 may be in a range of about 21 inches to about 23 inches. In some embodiments, the first pitch D1 between centers of two adjacent load lock chambers 122 may be about 22 inches. Other distances for the first pitch D1 may also be possible.

In some embodiments, at least one pair of two adjacent process chambers 120 are horizontally spaced by a second pitch D2 that is different from the first pitch D1 (e.g., second pitch D2 may be greater than first pitch D1). In some embodiments, the second pitch D2 between centers of the two adjacent process chambers 120 may be in a range of about 32 inches to about 40 inches. In some embodiments, the second pitch D2 between centers of two adjacent process chambers 120 may be in a range of about 34 inches to about 38 inches. In some embodiments, the second pitch D2 between centers of two adjacent process chambers 120 may be about 36 inches. Other distances for the second pitch D2 may also be possible.

One or more of the load lock chambers 122 may be accessed by the robot apparatus 102 through slit valves 134. One or more of the process chambers 120 may be accessed by the robot apparatus 102 through slit valves 140.

A robot apparatus according to embodiments described herein includes at least one lower arm configured to rotate about a first rotational axis; at least one upper arm coupled to the at least one lower arm at a second rotational axis that is spaced away from the first rotational axis; a first end effector rotatably coupled to the at least one upper arm optionally through a first forearm; and a second end effector rotatably coupled to the at least one upper arm optionally through a second forearm. In certain embodiments, the first end effector and the second end effector of robot apparatus 102 are co-planar.

The slit valves 134 and 140 may have a slit valve width that allows the robot apparatus 102, and particularly, the first end effector and the second end effector, to access them in both, dual substrate handling mode and in single substrate handling mode. In certain embodiments, the first end effector and/or the second end effector access the slit valve(s) 134 and/or slit valve(s) 140 orthogonally (relative to the horizontal opening of slit valve 134 or of slit valve 140). In alternative embodiments, the first end effector and/or the second end effector access the slit valve(s) 134 and/or the slit valve(s) 140 at an angle (relative to the horizontal center line of slit valve 134 or of slit valve 140). The first and/or the second end effector(s) may access one or more of slit valve(s) 134 and/or 140 at an angle ranging from about 0° to about 20°, from about 5° C. to about 17°, or from about 7° to about 14° relative, when measured relative to the horizontal center line of slit valve 134 or of slit valve 140.

"Dual substrate handling mode," as used herein refers to the robot apparatus 102 concurrently accessing two adjacent load lock chambers (e.g., load lock chambers 122) or at least one pair of adjacent process chambers (e.g., process chambers 120). When the robot apparatus 102 is in dual substrate handling mode, the first end effector and the second end effector are to independently or jointly rotate about one or more additional axis that are different from the first rotational axis and from the second rotational axis to space the first end effector from the second end effector by the first pitch D1 or by the second pitch D2.

"Single substrate handling mode," as used herein refers to the robot apparatus accessing one load lock chamber (e.g., load lock chamber 122) or one process chamber (e.g., process chamber 120). When the robot apparatus 102 is in single substrate handling mode, the first end effector and the second end effector are to independently rotate about one or more additional axis that are different from the first rotational axis and from the second rotational axis to align the first end effector and the second end effector at a configuration suitable for one of the first end effector or the second end effector to access one load lock chamber or one process chamber. The second end effector that is not being used to pick or place a substrate may be rotated out of the way so that it does not interfere with picking or placing of the substrate by the first end effector that is performing picking and placing of a substrate.

The term "access," as used herein with reference to the one or more of the end effectors accessing one or more load lock chamber(s) and/or process chamber(s) refers to the end effector(s) accessing said chamber to pick up substrate(s), drop off substrate(s), exchange substrate(s), and/or any other operation those skilled in the art would understand to be performed by end effectors accessing a load lock chamber(s) and/or a process chamber(s).

Various embodiments of robot apparatus 102 are contemplated herein, as will be illustrated in further detail with respect to FIGS. 2A-2B, 5A-5B, and 8A-8C. The mode of operation for dual substrate handling mode and single substrate handling mode may vary for different embodiments of robot apparatus 102, as will be illustrated in further detail with respect to FIGS. 3A-3D, 4A-4D, 6A-6D, and 7A-7D.

A controller 142 may be in communication with the robot apparatus 102. The robot apparatus 102 may be controlled by suitable commands from the controller 142. The controller 142 may also control the slit valves 134 and 140 and other components and processes taking place within the main frame 104, load lock chambers 122, and processing chambers 120.

Figure 2B:
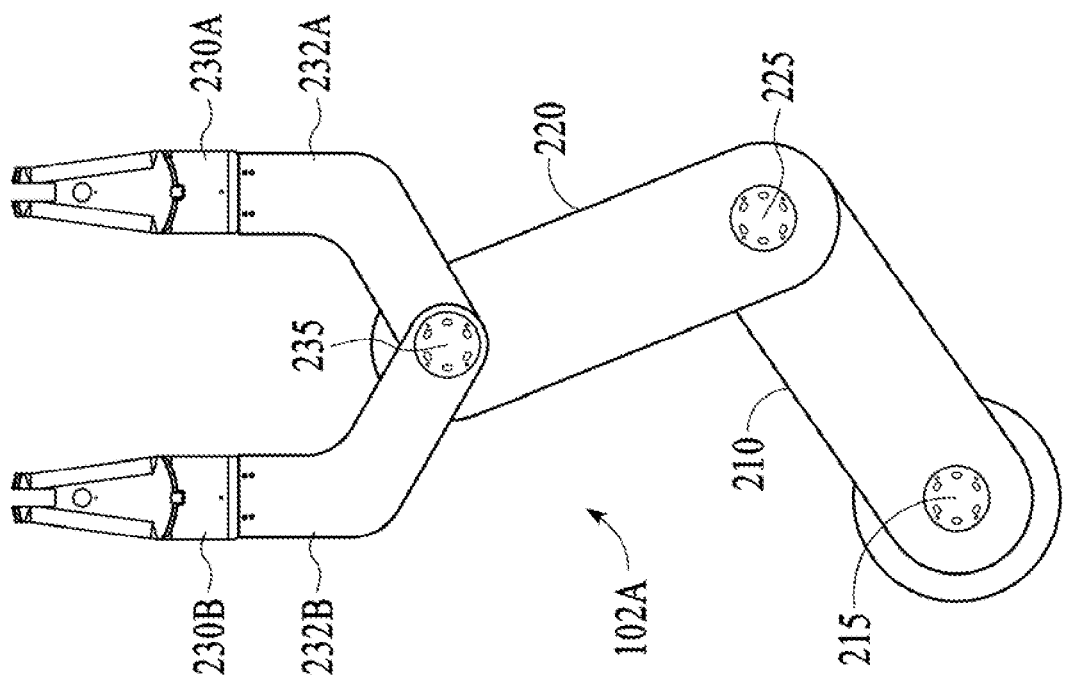
FIG. 2B illustrates a top view of a robot apparatus according to the disclosed embodiments.
Figure 2A:
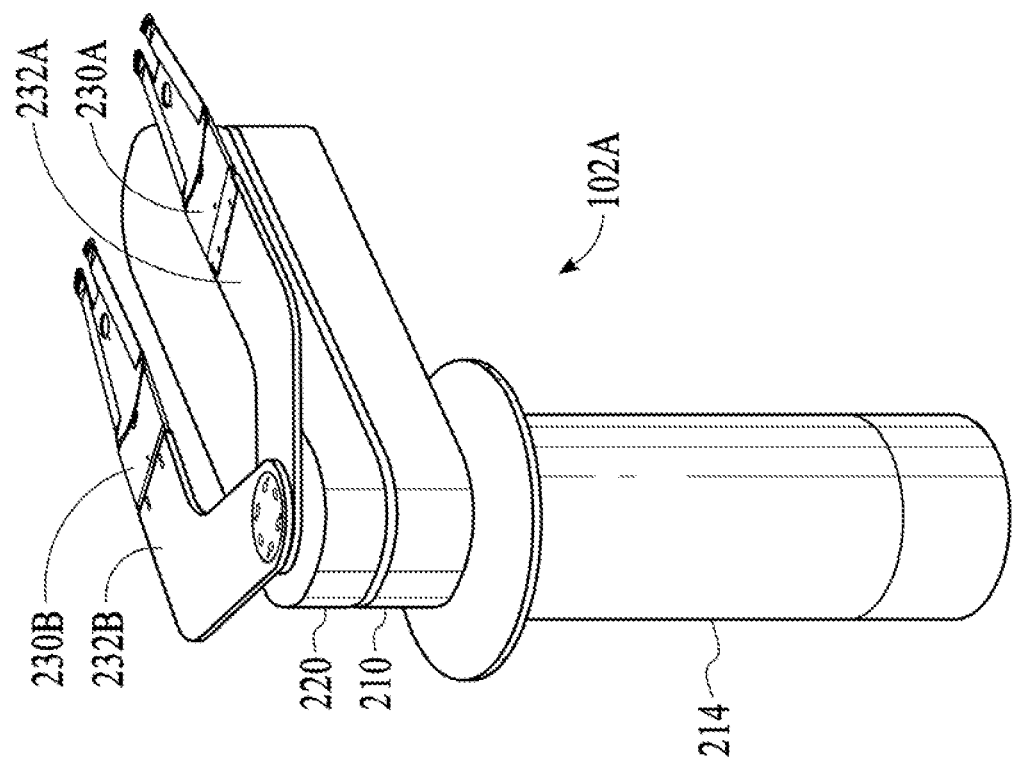
FIG. 2A illustrates a perspective view of a robot apparatus according to the disclosed embodiments.

Additional reference is made to FIG. 2A, which illustrates a perspective view of an embodiment of the robot apparatus 102 according to disclosed embodiments, and to FIG. 2B which illustrates a top view of the robot apparatus 102 according to disclosed embodiments. In the embodiment shown in FIGS. 2A-2B, robot apparatus 102A is illustrated. The robot apparatus 102A may include one lower arm 210 configured to rotate about the first rotational axis 215. For example, one or more motors (not shown) located in the base 214 may rotate the one lower arm 210 about the first rotational axis 215. The robot apparatus 102A may further include one upper arm 220 rotatably coupled to the one lower arm 210 at a second rotational axis 225 that is spaced away from the first rotational axis 215. Upper arm 220 may be configured to rotate about the second rotational axis 225. For example, one or more motors (not shown) located in the base 214 may rotate the one upper arm 220 about the second rotational axis 225. In some embodiments, portions of the lower arm 210 and portions of the upper arm 220 may operate on different planes, one above the other.

The robot apparatus 102A may further include a first end effector 230A that is rotatably coupled to the one upper arm 220 at a third rotational axis 235 spaced from the second rotational axis 225. The first end effector may include a first bend 232A in a first direction within a horizontal plane. The robot apparatus 102A may also include a second end effector 230B that is rotatably coupled to the one upper arm 220 at the third rotational axis 235. The second end effector may include a second bend 232B in a second direction within a horizontal plane, wherein the second direction is opposite the first direction. The first end effector 230A and the second end effector 230B may be configured to rotate independently about the third rotational axis 235 for both, the dual substrate handling mode and the single substrate handling mode. For example, one or more motors (not shown) located in the base 214 may independently rotate the first end effector 230A and second end effector 230B about the third rotational axis 235 or both, the dual substrate handling mode and the single substrate handling mode.

In certain embodiments, the instant disclosure encompasses a method of transferring substrates by operating a robot apparatus in a dual substrate handling mode and in a single substrate handling mode. The operation of robot apparatus 102A in a dual substrate handling mode is further described with reference to FIGS. 3A-3D.

Figure 3A:
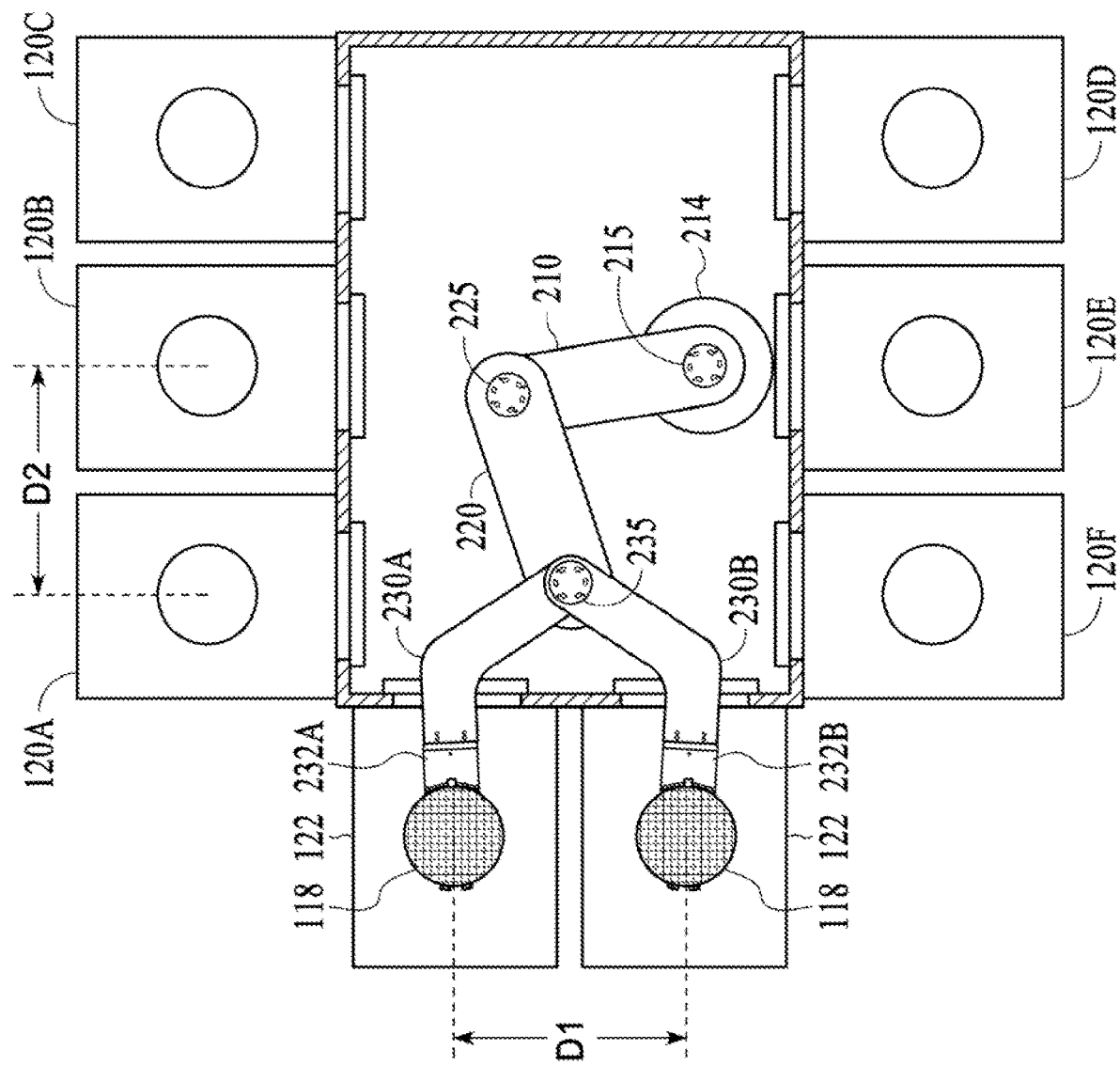
FIGS. 3A-3D illustrate schematics illustrative of the dual substrate handling mode of the robot apparatus of FIGS. 2A-2B.
Figure 3B:
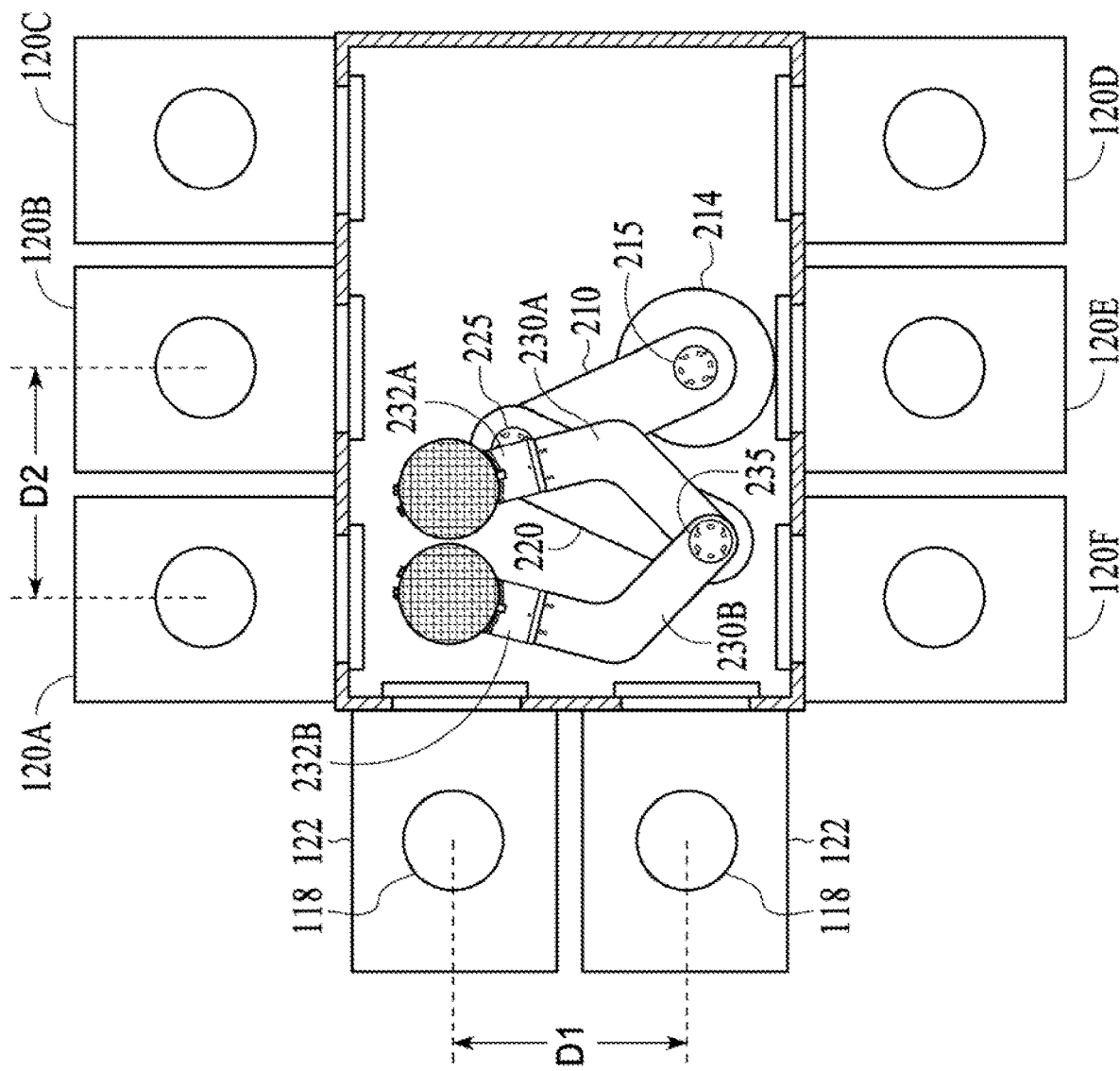

In FIG. 3A, robot apparatus 102A, as described with respect to FIGS. 2A-2B, is shown in an extended configuration suitable for reaching into (or accessing) two horizontally adjacent load lock chambers (such as load lock chambers 122 from FIG. 1). This configuration will be referred to herein as "dual load lock reach." The first end effector 230A and the second end effector 230B may be independently rotated about third rotational axis 235 to arrive at the dual load lock reach where the two end effectors are spaced by a first pitch. As can be seen in FIG. 3A, in dual load lock reach, the first end effector 230A is spaced from the second end effector 230B by a first pitch D1. In some embodiments, the first pitch D1 is measured between a first end point 232A of the first end effector 230A and a second end point 232B of the second end effector 230B, as shown in the FIG. 3A configuration, and said first pitch D1 corresponds to the distance between the centers of two horizontally adjacent load locks 122. In some embodiments, the first pitch D1 between centers of the two adjacent load lock chambers 122 may be in a range of about 20 inches to about 25 inches. In some embodiments, the first pitch D1 between centers of two adjacent load lock chambers 122 may be in a range of about 21 inches to about 23 inches. In some embodiments, the first pitch D1 between centers of two adjacent load lock chambers 122 may be about 22 inches. Other distances for the first pitch D1 may also be possible.

In certain embodiments, the first end effector 230A and the second end effector 230B access both slit valves 134 of load lock chambers 122 concurrently and at an angle (relative to the horizontal center line of slit valve 134 or of slit valve 140), as shown in FIG. 3A. In certain embodiments (not shown), the first end effector 230A and the second end effector 230B access both slit valves 134 concurrently and orthogonally (relative to the horizontal opening of slit valve 134 or of slit valve 140).

In the dual load lock reach, robot apparatus 102A can access both load lock chambers 122 to retrieve two substrates 118 to transfer them to two process chambers 120 or to place processed substrates thereon to be transferred out of the main frame 104.

To further describe the dual substrate handling mode, it will be assumed that robot apparatus 102A retrieves two substrates 118 from load lock chambers 122 to transfer them to two horizontally adjacent process chambers 120. Upon retrieval of the two substrates, the robot apparatus 102A swivels within transfer chamber 106 to arrive at a "chamber preposition" alignment (FIG. 3B) in which the first end effector 230A and the second end effector 230B may be rotated, about the third rotational axis 235, into a position suitable for accessing two horizontally adjacent process chambers 120. Swiveling may involve one or more of: rotating the lower arm 210 about first rotational axis 215, rotating upper arm 220 about second rotational axis 225, and/or rotating one or more of the first end effector 230A or the second end effector 230B, independently, about the third rotational axis 235.

Upon reaching the "chamber preposition" alignment, the first end effector 230A and second end effector 230B may be further separated by a second pitch D2. The first end effector 230A and the second end effector 230B may be independently rotated about third rotational axis 235 to arrive at the dual process chamber reach where the two end effectors are spaced by a second pitch. In some embodiments, the second pitch D2 is measured between a first end point 232A of the first end effector 230A and a second end point 232B of the second end effector 230B, as shown in the FIG. 3C configuration, and said second pitch D2 corresponds to the distance between the centers of two horizontally adjacent process chambers 120. In some embodiments, the second pitch D2 between centers of the two adjacent process chambers 120 may be in a range of about 32 inches to about 40 inches. In some embodiments, the second pitch D2 between centers of two adjacent process chambers 120 may be in a range of about 34 inches to about 38 inches. In some embodiments, the second pitch D2 between centers of two adjacent process chambers 120 may be about 36 inches. Other distances for the second pitch D2 may also be possible.

In certain embodiments (not shown), the first end effector 230A and the second end effector 230B access both slit valves 140 of two horizontally adjacent process chambers 120 concurrently and at an angle (relative to the horizontal center line of slit valve 140). In certain embodiments, the first end effector 230A and the second end effector 230B access both slit valves 140 of two horizontally adjacent process chambers 120 concurrently and orthogonally (relative to the horizontal opening of slit valve 140), as shown in FIG. 3C.

Figure 3C:
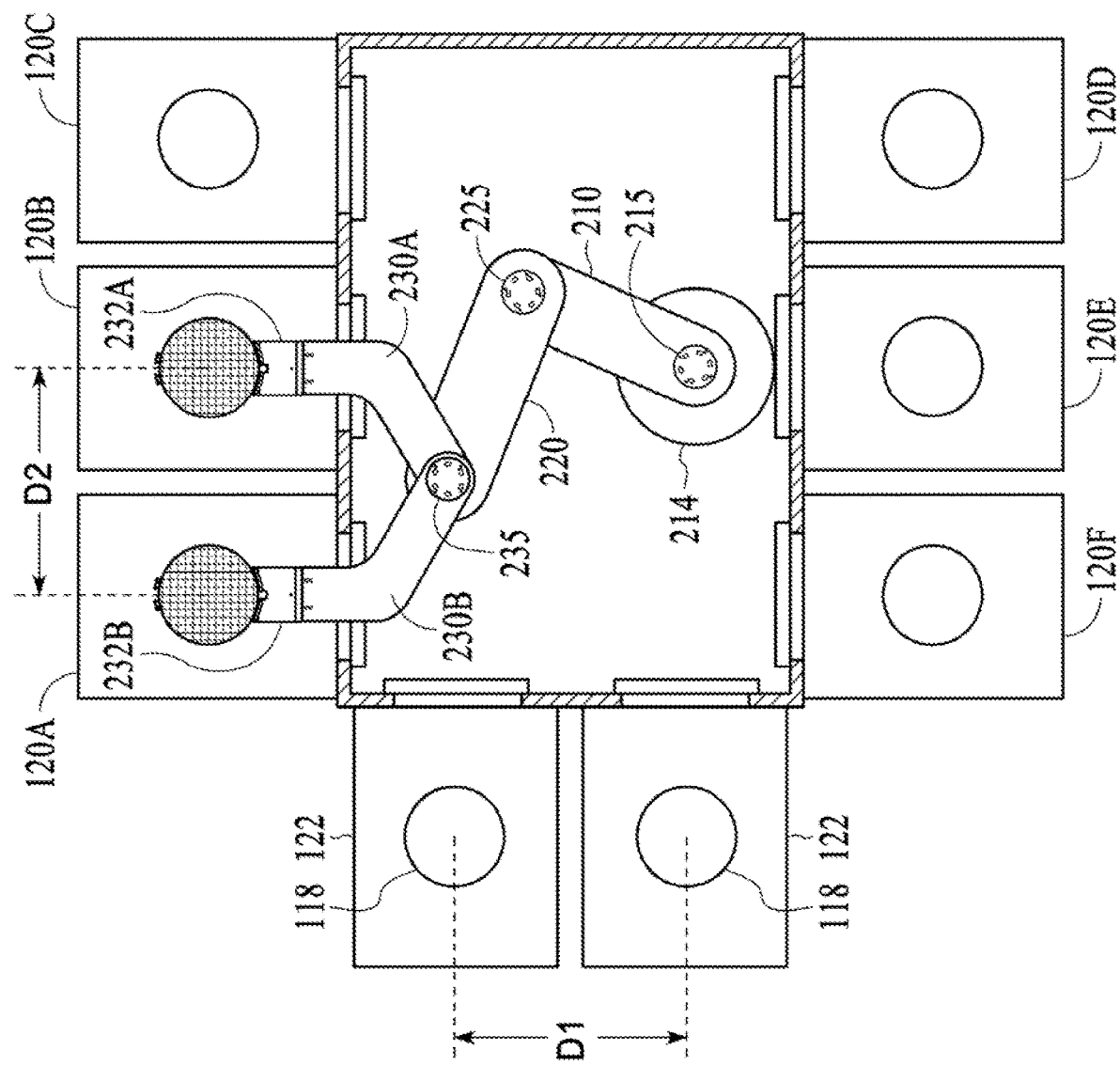

In FIG. 3C, robot apparatus 102A is shown in an extended configuration suitable for reaching into (or accessing) two horizontally adjacent process chambers (such as process chambers 120 from FIG. 1). This configuration will be referred to herein as "dual process chamber reach." As can be seen in FIG. 3C, in the dual process chamber reach, the first end effector 230A is spaced from the second end effector 230B by the second pitch D2. In the dual process chamber reach, robot apparatus 102A can access two adjacent process chambers 120 to place two substrates 118 for processing (or to retrieve processed substrates to transfer them for further processing or to the load lock chambers 122).

Figure 3D:
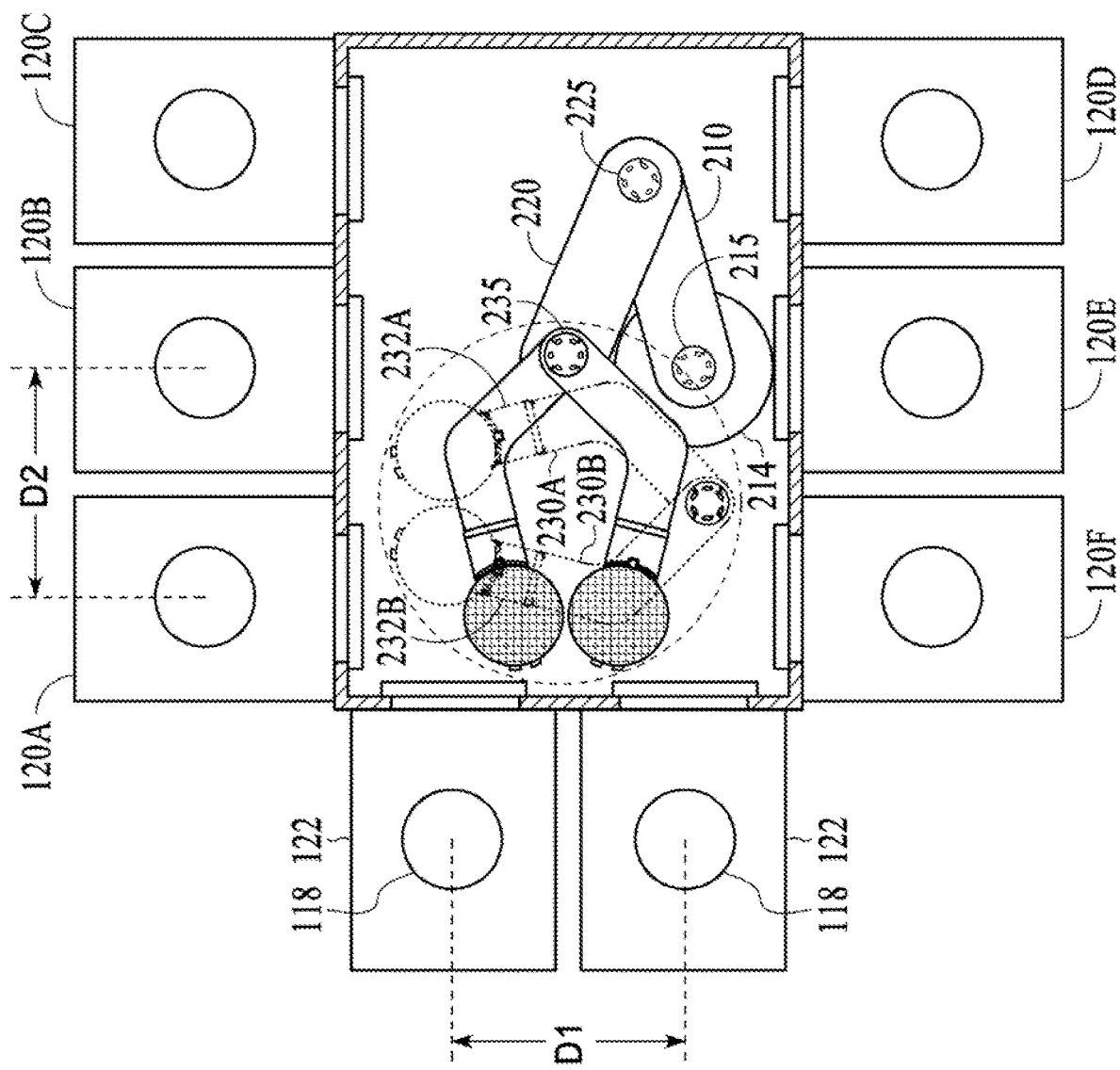

After processing, robot 102A may retrieve processed substrates from a pair of horizontally adjacent process chambers 120 in the "dual process chamber reach" configuration, swivel within transfer chamber 106, and arrive at a "loadlock preposition" alignment, as shown in FIG. 3D. Swiveling may involve one or more of: rotating the lower arm 210 about first rotational axis 215, rotating upper arm 220 about second rotational axis 225, and/or rotating one or more of the first end effector 230A or the second end effector 230B, independently, about the third rotational axis 235. Upon reaching the "loadlock preposition" alignment shown in FIG. 3D, robot apparatus 102A may repeat operations 3A through 3D cyclically to sequentially load and/or unload process chambers 120 and load lock chambers 122 in electronic device processing system 100.

The operation of robot apparatus 102A in a single substrate handling mode is further described with reference to FIGS. 4A-4D.

Figure 4A:
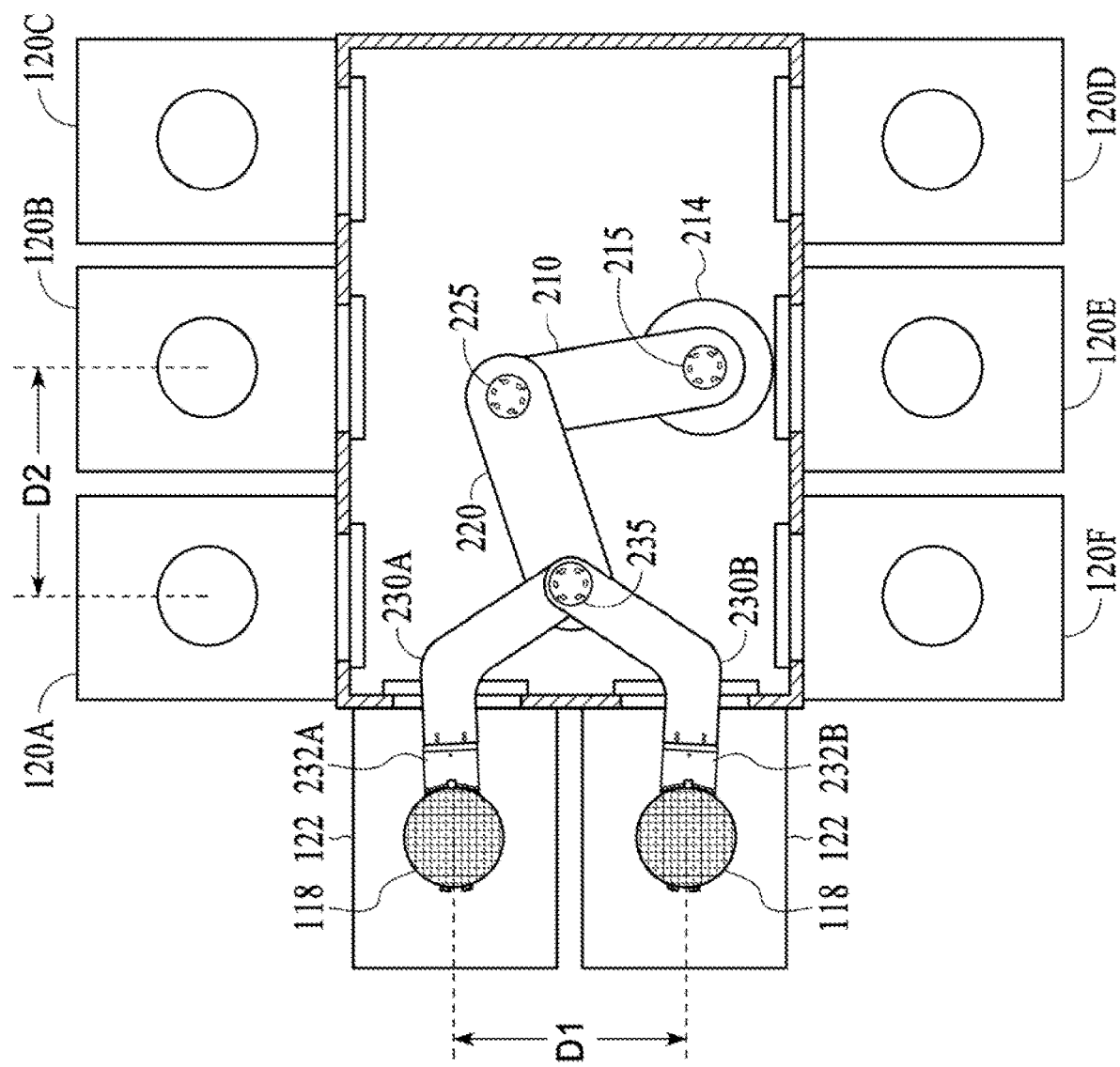
FIGS. 4A-4D illustrate schematics illustrative of the single substrate handling mode of the robot apparatus of FIGS. 2A-2B.

In FIG. 4A, robot apparatus 102A, is shown in the "dual load lock reach," as explained with respect to FIG. 3A. In the dual load lock reach, robot apparatus 102A can access both load lock chambers 122 to retrieve two substrates 118, which can then be concurrently placed in two horizontally adjacent process chambers 120 as shown with respect to FIGS. 3B-3C. Alternatively, the two substrates 118 may be sequentially unloaded into two process chambers (which may or may not be horizontally adjacent), as shown with respect to FIGS. 4B-4C.

Although not shown in the figures, robot apparatus 102A can also access one load lock chamber 122 to retrieve a single substrate 118 at a time. This may be useful to continue operation of the electronic device processing system when, for example, one load lock chamber is out of repair. For instance, end effector 230A could access either one of load lock chambers 122 without accessing the other. Similarly, end effector 230B could access either one of load lock chambers 122 without accessing the other. Doing so would involve independently rotating the first end effector 230A and the second end effector 230B about the third rotational axis 235 to align the first end effector 230A and the second end effector 230B in a configuration suitable for one of the first end effector 230A or the second end effector 230B to access one load lock chamber 122. In certain embodiments, slits valves 134 of load lock chambers 122 may have a width suitable for accommodating access of the first end effector 230A and/or the second end effector 230B, whether both are accessing two load lock chamber concurrently or one load lock chamber sequentially.

The angle at which the first end effector and/or the second end effector would access one or more load lock chambers may also vary depending on whether two load lock chambers are accessed concurrently or one load lock chamber is accessed sequentially by both end effectors. In certain embodiments, the first end effector 230A and the second end effector 230B access both slit valves 134 concurrently and orthogonally (relative to the horizontal opening of slit valve 134). In certain embodiments, the first end effector 230A and the second end effector 230B access both slit valves 134 concurrently and at an angle (relative to the horizontal center line of slit valve 134). In certain embodiments, the first end effector 230A and/or the second end effector 230B access the slit valve 134 of a single load lock chamber sequentially and orthogonally (relative to the horizontal opening of slit valve 134). In certain embodiments, the first end effector 230A and/or the second end effector 230B access the slit valve 134 of a single load lock chamber sequentially and at an angle (relative to the horizontal center line of slit valve 134).

Figure 4B:
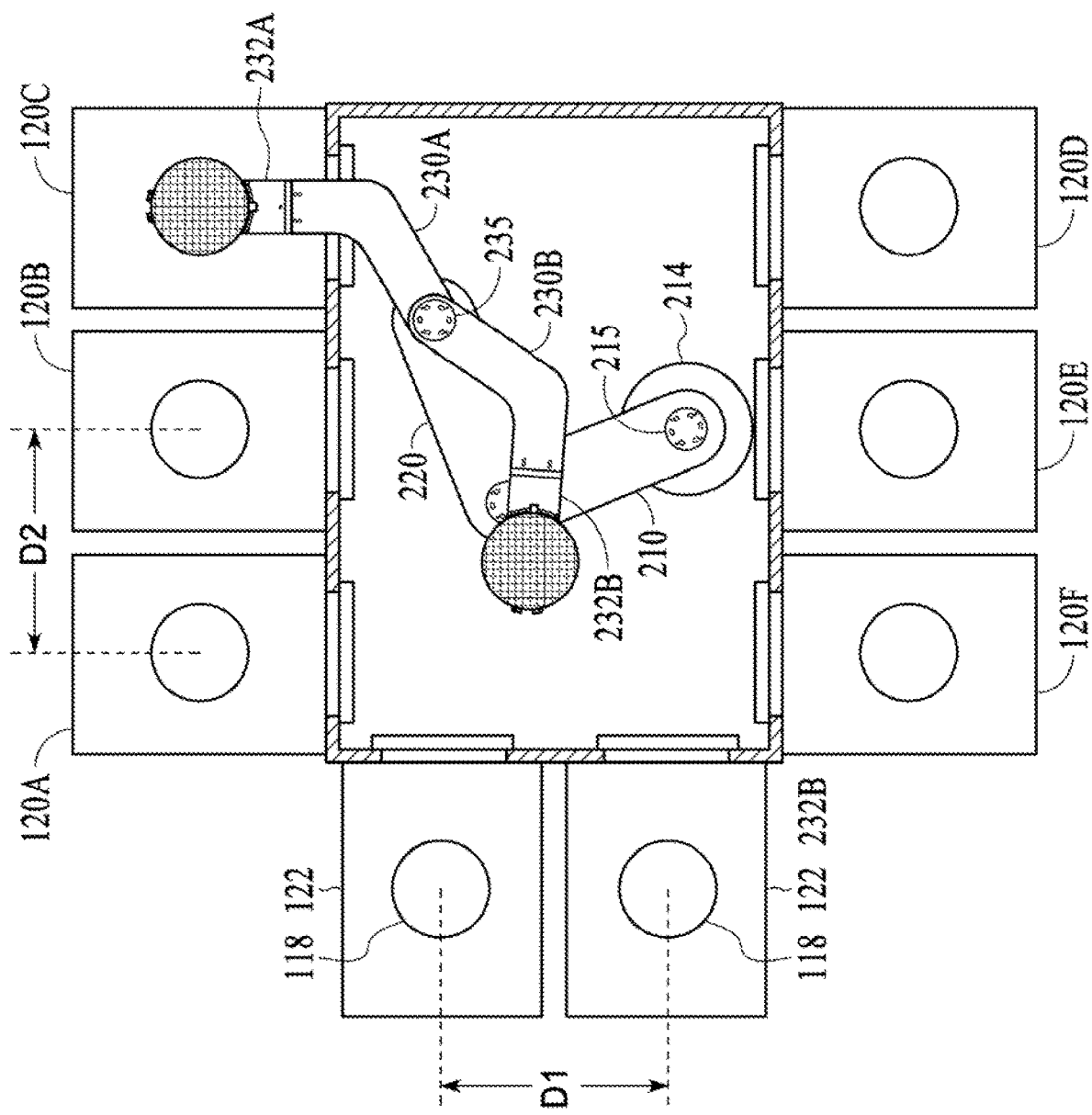
Figure 4C:
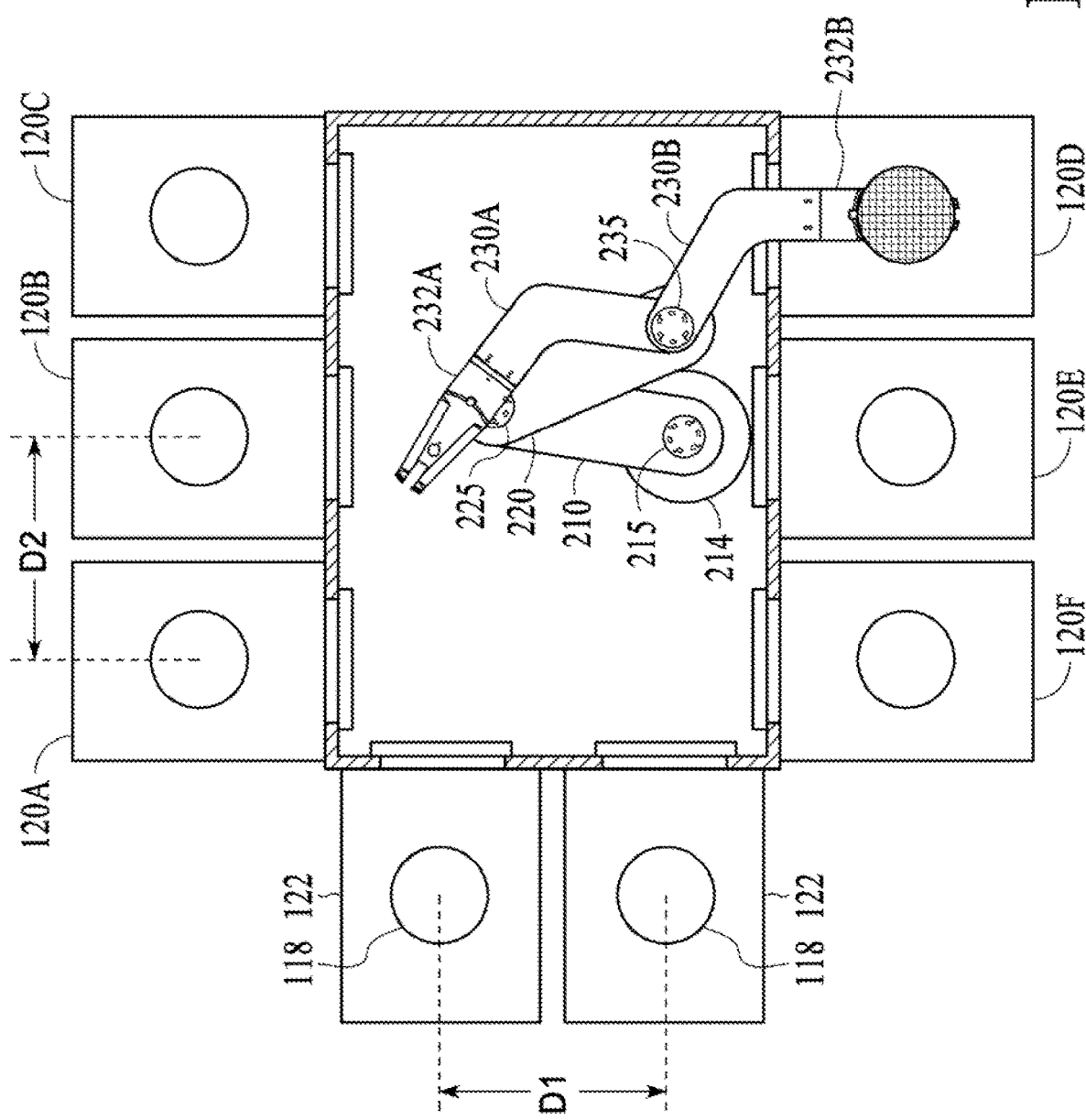

In FIGS. 4B and 4C, the first end effector 230A and the second end effector 230B independently rotate about the third rotational axis 235 to align the first end effector 230A and the second end effector 230B in a configuration suitable for one of the first end effector 230A or the second end effector 230B to access one process chamber 120. For example, in FIG. 4B, first end effector 230A unloads a substrate into one process chamber and thereafter second end effector 230B unloads a substrate into another process chamber (positioned on the opposite side of the process chamber that received the substrate from first end effector 230A).

In FIG. 4C, the first end effector 230A and the second end effector 230B independently rotate about the third rotational axis 235 to align the first end effector 230A and the second end effector 230B in a configuration suitable for one of the first end effector 230A or the second end effector 230B to access one process chamber 120.

In certain embodiments, the first end effector 230A and the second end effector 230B can sequentially access one slit valve 140 of the same process chamber 120 or of two separate process chambers 120 (that may or may not be in horizontally adjacent locations). In certain embodiments (not shown), the first end effector 230A and/or the second end effector 230B access a given slit valve 140 at an angle (relative to the horizontal center line of slit valve 140). In certain embodiments, the first end effector 230A and/or the second end effector 230B access a slit valve 140 of a process chamber orthogonally (relative to the horizontal opening of slit valve 140), as shown in FIGS. 4B and 4C.

Figure 4D:
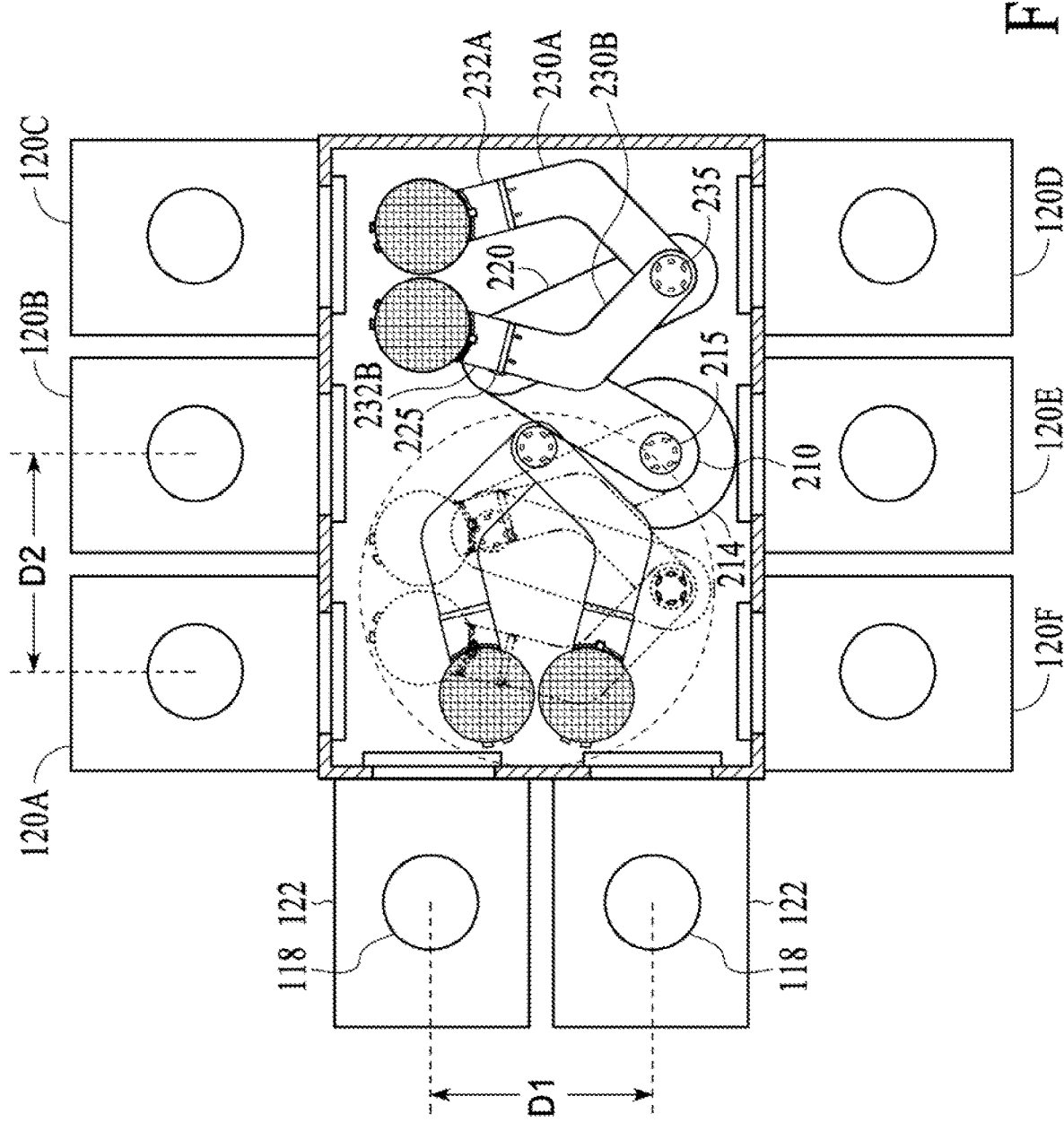

After processing, robot 102A may retrieve processed substrates sequentially with the "single process chamber reach" configurations shown in FIGS. 4B-4C, swivel within transfer chamber 106, and arrive at a "loadlock preposition" alignment, as shown in FIG. 4D. Swiveling may involve one or more of: rotating the lower arm 210 about first rotational axis 215, rotating upper arm 220 about second rotational axis 225, and/or rotating one or more of the first end effector 230A or the second end effector 230B, independently, about the third rotational axis 235. Upon reaching the "loadlock preposition" alignment shown in FIG. 4D, robot apparatus 102A may repeat operations 4A through 4D cyclically to sequentially load and/or unload process chambers 120 and load lock chambers 122 in electronic device processing system 100.

Robot apparatus 102A may also use a combination of dual substrate operation mode, in accordance with FIGS. 3A-3D, and single substrate operation mode, in accordance with FIGS. 4A-4D, to load and/or unload process chambers 120 and load lock chambers 122 in electronic device processing system 100.

For instance, in an electronic device processing system with six process chambers 120 (three on a first side and three on a second side that is opposite the first side), robot apparatus 102A may load substrates into the six process chambers in three runs, as follows: 1) dual substrate operation mode to concurrently load two substrates into one pair of horizontally adjacent process chambers on the first side (e.g., process chambers 120A and 120B); 2) dual substrate operation mode to concurrently load two substrates into one pair of horizontally adjacent process chambers on the second side (e.g., process chambers 120E and 120F); 3) single substrate operation mode to sequentially load one substrate into the remaining empty process chamber on the first side (e.g., process chamber 120C) followed by loading one substrate into the remaining empty process chamber on the second side (e.g., process chamber 120D). A similar sequence may be used to unload the same exemplary electronic device processing system. A similar sequence with more or fewer runs may also be implemented for other electronic device processing systems with more or fewer process chambers.

The sequence illustrated herein should not be construed as limiting. For instance, process chambers 120B and 120C may be loaded concurrently, process chambers 120D and 120E may be loaded concurrently, and process chambers 120A and 120F may be loaded sequentially. In another embodiment, process chambers 120A and 120B may be loaded concurrently, process chambers 120D and 120E may be loaded concurrently, and process chambers 120C and 120F may be loaded sequentially. In yet another embodiment, process chambers 120B and 120C may be loaded concurrently, process chambers 120E and 120F may be loaded concurrently, and process chambers 120A and 120D may be loaded sequentially. The order of loading and unloading the process chambers should also not be construed as limiting.

In another example, in an electronic device processing system with six process chambers 120 (three on a first side and three on a second side that is opposite the first side) with one operational load lock chamber (e.g., 122A), robot apparatus 102A may operate according to the following sequence: 1) single substrate operation mode to pick up one substrate from load lock chamber 122A with second end effector 230B; 2) single substrate operation mode to pick up a second substrate from load lock chamber 122A with first end effector 230A; 3) dual substrate operation mode to concurrently load two substrates into one pair of horizontally adjacent process chambers, or single substrate operation mode to sequentially load one substrate one process chamber followed by loading the second substrate into another process chamber; 4) repeating 1) through 3) until the electronic device processing system is fully loaded. A similar sequence may be used to unload the same exemplary electronic device processing system. A similar sequence with more or fewer runs may also be implemented for other electronic device processing systems with more or fewer process chambers. A similar sequence may also be used when the one operational load lock chamber is load lock chamber 122B.

Figure 5B:
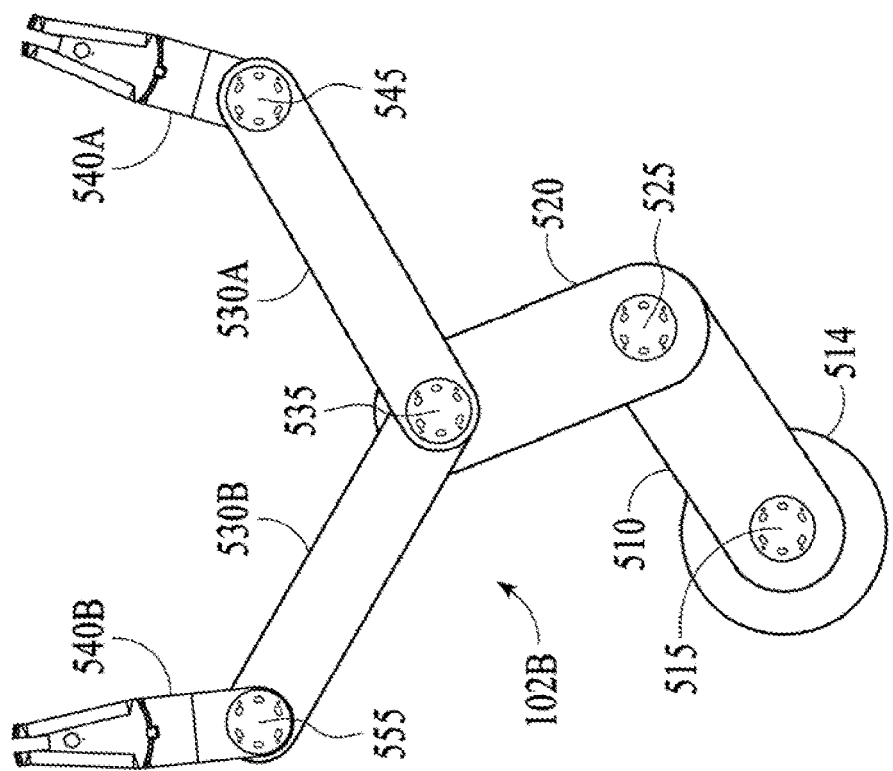
FIG. 5B illustrates a top view of a robot apparatus according to the disclosed embodiments.
Figure 5A:
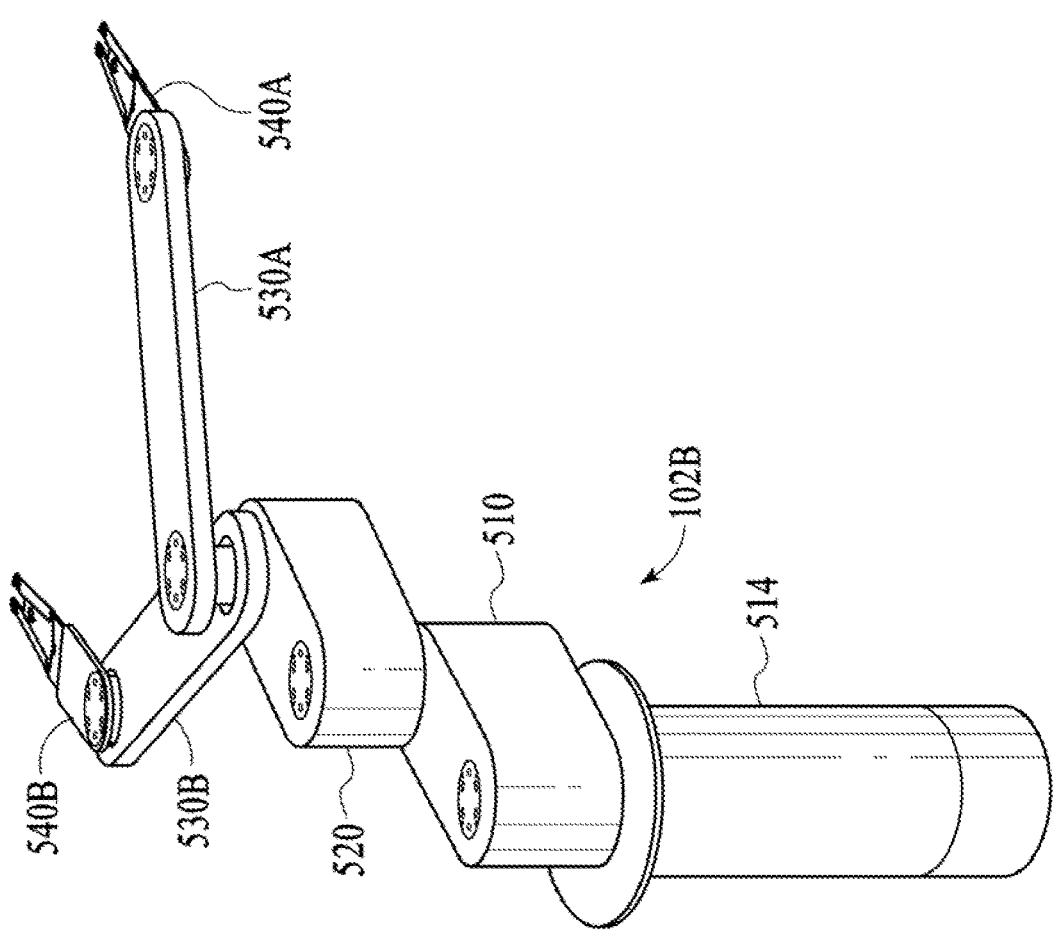
FIG. 5A illustrates a perspective view of a robot apparatus according to the disclosed embodiments.

Additional reference is made to FIG. 5A, which illustrates a perspective view of an embodiment of the robot apparatus 102 according to disclosed embodiments, and to FIG. 5B which illustrates a top view of the robot apparatus 102 according to disclosed embodiments. In the embodiment shown in FIGS. 5A-5B, robot apparatus 102B is illustrated. The robot apparatus 102B may include one lower arm 510 configured to rotate about the first rotational axis 515. For example, one or more motors (not shown) located in the base 514 may rotate the one lower arm 510 about the first rotational axis 515. The robot apparatus 102B may further include one upper arm 520 rotatably coupled to the one lower arm 510 at a second rotational axis 525 that is spaced away from the first rotational axis 515. Upper arm 520 may be configured to rotate about the second rotational axis 525. For example, one or more motors (not shown) located in the base 514 may rotate the one upper arm 520 about the second rotational axis 525. In some embodiments, portions of the lower arm 510 and portions of the upper arm 520 may operate on different planes, one above the other.

The robot apparatus 102B may further include a first forearm 530A and a second forearm 530B, that are each rotatably coupled to the one upper arm 520 at a third rotational axis 535 spaced from the second rotational axis 525. The first forearm 530A and the second forearm 530B may be configured to rotate independently about the third rotational axis 535 for both, the dual substrate handling mode and the single substrate handling mode. For example, one or more motors (not shown) located in the base 514 may independently rotate the first forearm 530A and second forearm 530B about the third rotational axis 535 for both, the dual substrate handling mode and the single substrate handling mode.

The robot apparatus 102B may further include a first end effector 540A that is rotatably coupled to the first forearm 530A at a fourth rotational axis 545 spaced from the third rotational axis 535. The robot apparatus 102B may also include a second end effector 540B that is rotatably coupled to the second forearm 530B at a fifth rotational axis 555 spaced from the third rotational axis 535 and separate from the fourth rotational axis 545.

The first forearm 530A, the second forearm 530B, the first end effector 540A, and the second end effector 540B may be configured to rotate independently about the third rotational axis 535, the fourth rotational axis 545, and the fifth rotational axis 555, for both, the dual substrate handling mode and the single substrate handling mode. For example, one or more motors (not shown) located in the base 514 may independently rotate the first forearm 530A and the second forearm 530B about the third rotational axis 535, the first end effector 540A about the fourth rotational axis 545, and the second end effector 540B about the fifth rotational axis 555 for both, the dual substrate handling mode and the single substrate handling mode.

In an alternative embodiment, rather than a motor controlling one or more constituents of robot apparatus 102B, a cam pulley design or a combination of a cam pulley design and one or more motors may be used to control one or more constituents of robot apparatus 102B. For example, one motor (not shown) located in base 514 may be configured to independently rotate lower arm 510 about first rotational axis 515, one motor (not shown) located in base 514 may be configured to independently rotate upper arm 520 about second rotational axis 525, two motors (not shown) located in base 514 may be configured to independently rotate first forearm 530A and second forearm 530B about the third rotational axis 535, and a cam pulley design (not shown) may be configured to control the first forearm 530A, the second forearm 530B, the first end effector 540A, and the second end effector 540B to space the second end effector 540B from the first end effector 540A by a first pitch D1 or by a second pitch D2.

The operation of robot apparatus 102B in a dual substrate handling mode is further described with reference to FIGS. 6A-6D.

Figure 6A:
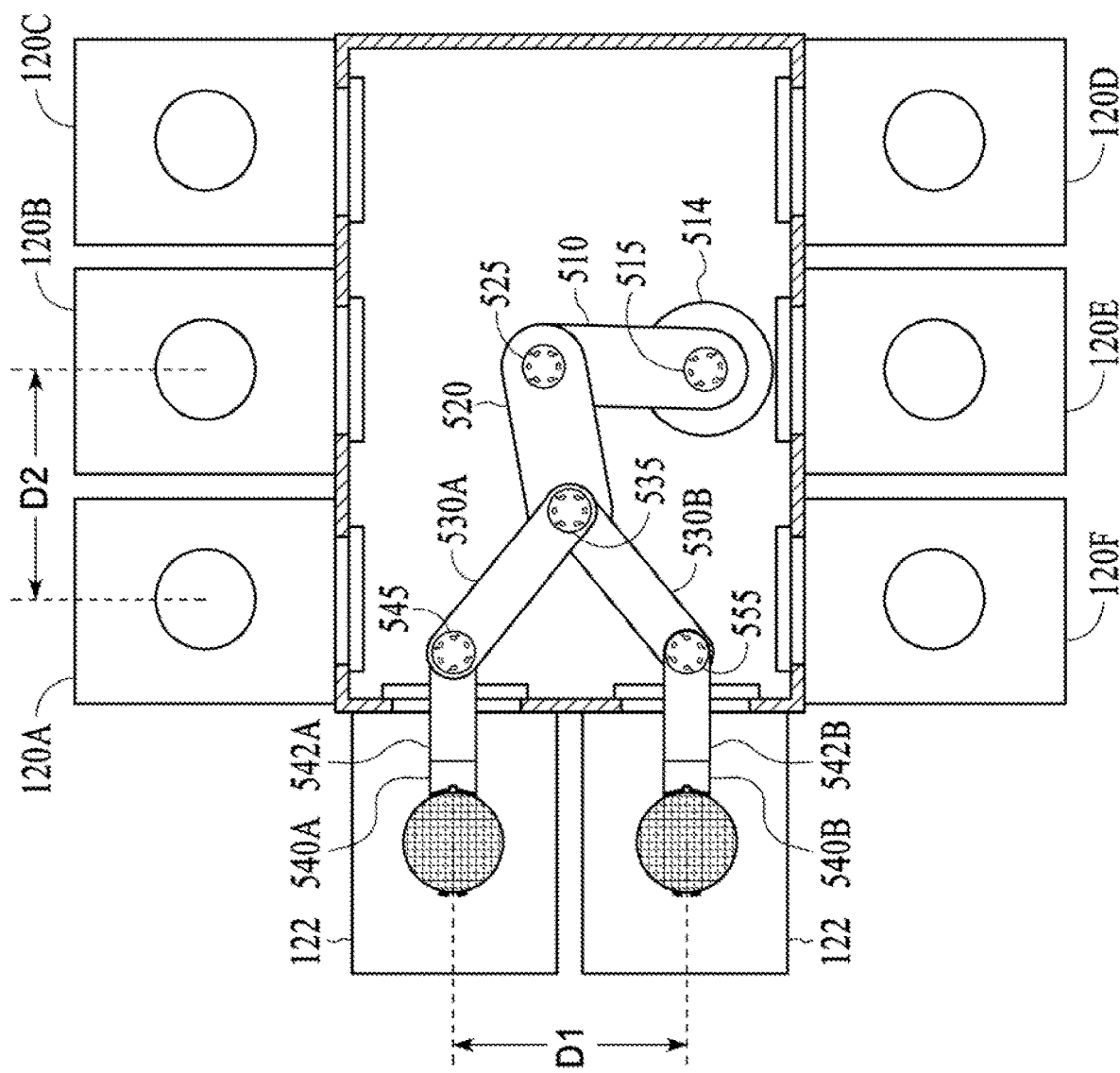
FIGS. 6A-6D illustrate schematics illustrative of the dual substrate handling mode of the robot apparatus of FIGS. 5A-5B.

In FIG. 6A, robot apparatus 102B, as described with respect to FIGS. 5A-5B, is shown in an extended configuration suitable for reaching into (or accessing) two horizontally adjacent load lock chambers (such as load lock chambers 122 from FIG. 1). This configuration will be referred to herein as "dual load lock reach." The first forearm 530A and the second forearm 530B may be independently rotated about third rotational axis 535, the first end effector 540A may be independently rotated about fourth rotational axis 545, and the second end effector 540B may be independently rotated about fifth rotational axis 555, to arrive at the dual load lock reach where the two end effectors are spaced by a first pitch. As can be seen in FIG. 6A, in dual load lock reach, the first end effector 540A is spaced from the second end effector 540B by a first pitch D1. In some embodiments, the first pitch D1 is measured between a first end point 542A of the first end effector 540A and a second end point 542B of the second end effector 540B, as shown in the FIG. 6A configuration, and said first pitch D1 corresponds to the distance between the centers of two horizontally adjacent load lock chambers 122. In some embodiments, the first pitch D1 between centers of the two adjacent load lock chambers 122 may be in a range of about 20 inches to about 25 inches. In some embodiments, the first pitch D1 between centers of two adjacent load lock chambers 122 may be in a range of about 21 inches to about 23 inches. In some embodiments, the first pitch D1 between centers of two adjacent load lock chambers 122 may be about 22 inches. Other distances for the first pitch D1 may also be possible.

In the dual load lock reach, robot apparatus 102B can access both load lock chambers 122 to retrieve two substrates 118 to transfer them to two process chambers 120 or to place processed substrates thereon to be transferred out of the main frame 104.

Figure 6B:
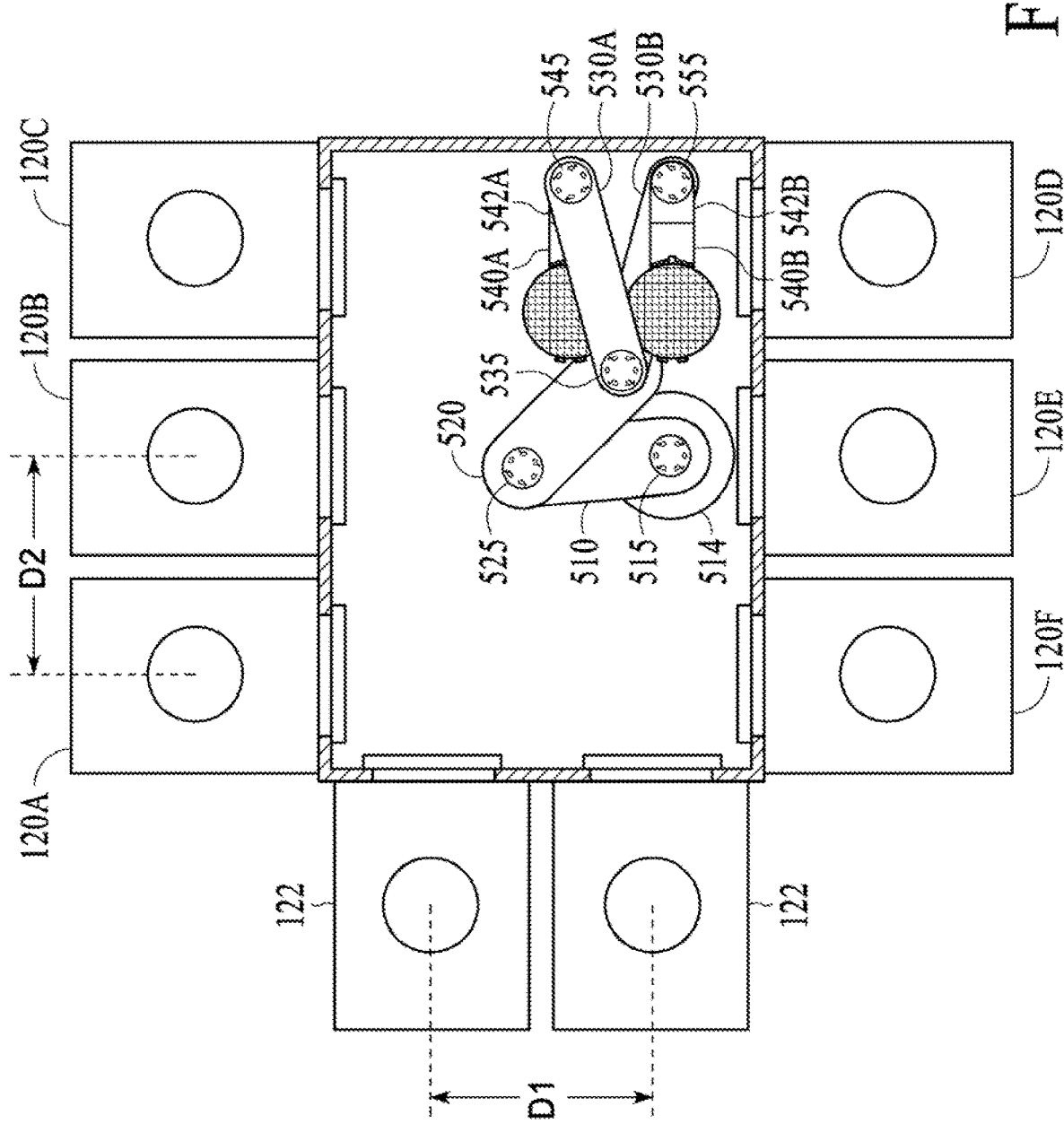

To further describe the dual substrate handling mode, it will be assumed that robot apparatus 102B retrieves two substrates 118 from load lock chambers 122 to transfer them to two horizontally adjacent process chambers 120. Upon retrieval of the two substrates, the robot apparatus 102B rotates (and/or contracts) the first forearm 530A, the second forearm 530B, the first end effector 540A, and the second end effector 540B, and swivels within transfer chamber 106 to arrive at a "chamber preposition" alignment, which in this embodiment may also be referred to as ""W" shape preposition" alignment (FIG. 6B). In the "W" shape preposition alignment, the first forearm 530A, the second forearm 530B, the first end effector 540A, and the second end effector 540B may be rotated about their corresponding rotational axis into a position suitable for accessing two horizontally adjacent process chambers 120. Swiveling may involve one or more of: rotating the lower arm 510 about first rotational axis 515; rotating upper arm 520 about second rotational axis 525; rotating one or more of the first forearm 530A or the second forearm 530B, independently, about the third rotational axis 535; rotating the first end effector 540A about fourth rotational axis 545; and/or rotating the second end effector about fifth rotational axis 555.

Upon reaching the "chamber preposition" alignment or ""W" shape preposition" alignment and swiveling into a direction suitable for process chamber reach, the first end effector 540A and second end effector 540B may be further separated by a second pitch D2. The first forearm 530A and the second forearm 530B may be independently rotated about third rotational axis 535, the first end effector 540A may be independently rotated about a fourth rotational axis 545, and the second end effector 540B may be independently rotated about a fifth rotational axis 555, to arrive at the dual process chamber reach where the two end effectors are spaced by a second pitch. In some embodiments, the second pitch D2 is measured between a first end point 542A of the first end effector 540A and a second end point 542B of the second end effector 540B, as shown in the FIG. 6C configuration, and said second pitch D2 corresponds to the distance between the centers of two horizontally adjacent process chambers 120. In some embodiments, the second pitch D2 between centers of the two adjacent process chambers 120 may be in a range of about 32 inches to about 40 inches. In some embodiments, the second pitch D2 between centers of two adjacent process chambers 120 may be in a range of about 34 inches to about 38 inches. In some embodiments, the second pitch D2 between centers of two adjacent process chambers 120 may be about 36 inches. Other distances for the second pitch D2 may also be possible.

Figure 6C:
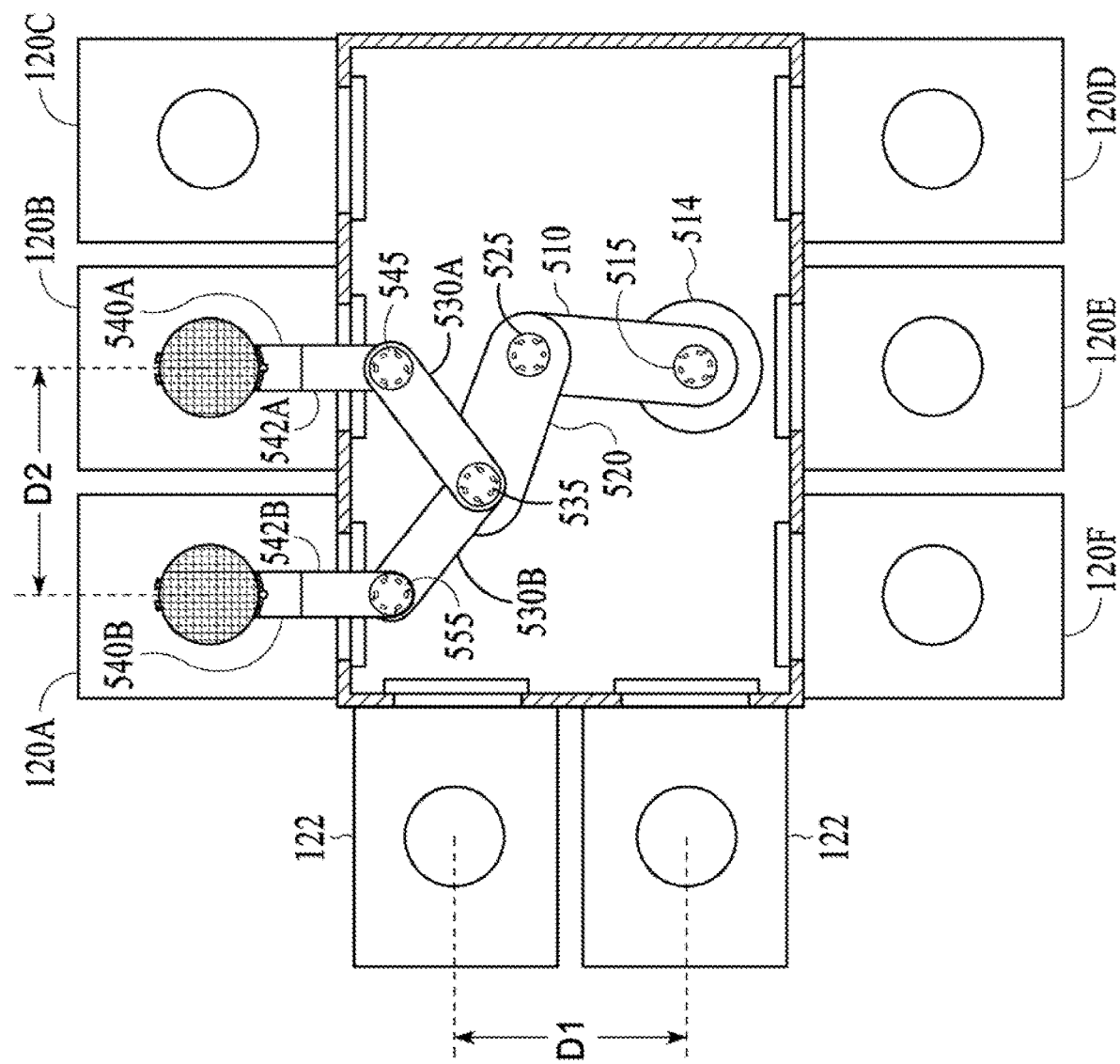

In FIG. 6C, robot apparatus 102B is shown in an extended configuration suitable for reaching into (or accessing) two horizontally adjacent process chambers (such as process chambers 120 from FIG. 1). This configuration will be referred to herein as "dual process chamber reach." As can be seen in FIG. 6C, in the dual process chamber reach, the first end effector 540A is spaced from the second end effector 540B by the second pitch D2. In the dual process chamber reach, robot apparatus 102B can concurrently access two adjacent process chambers 120 to place two substrates 118 for processing (or to retrieve processed substrates to transfer them for further processing or to the load lock chambers 122).

Figure 6D:
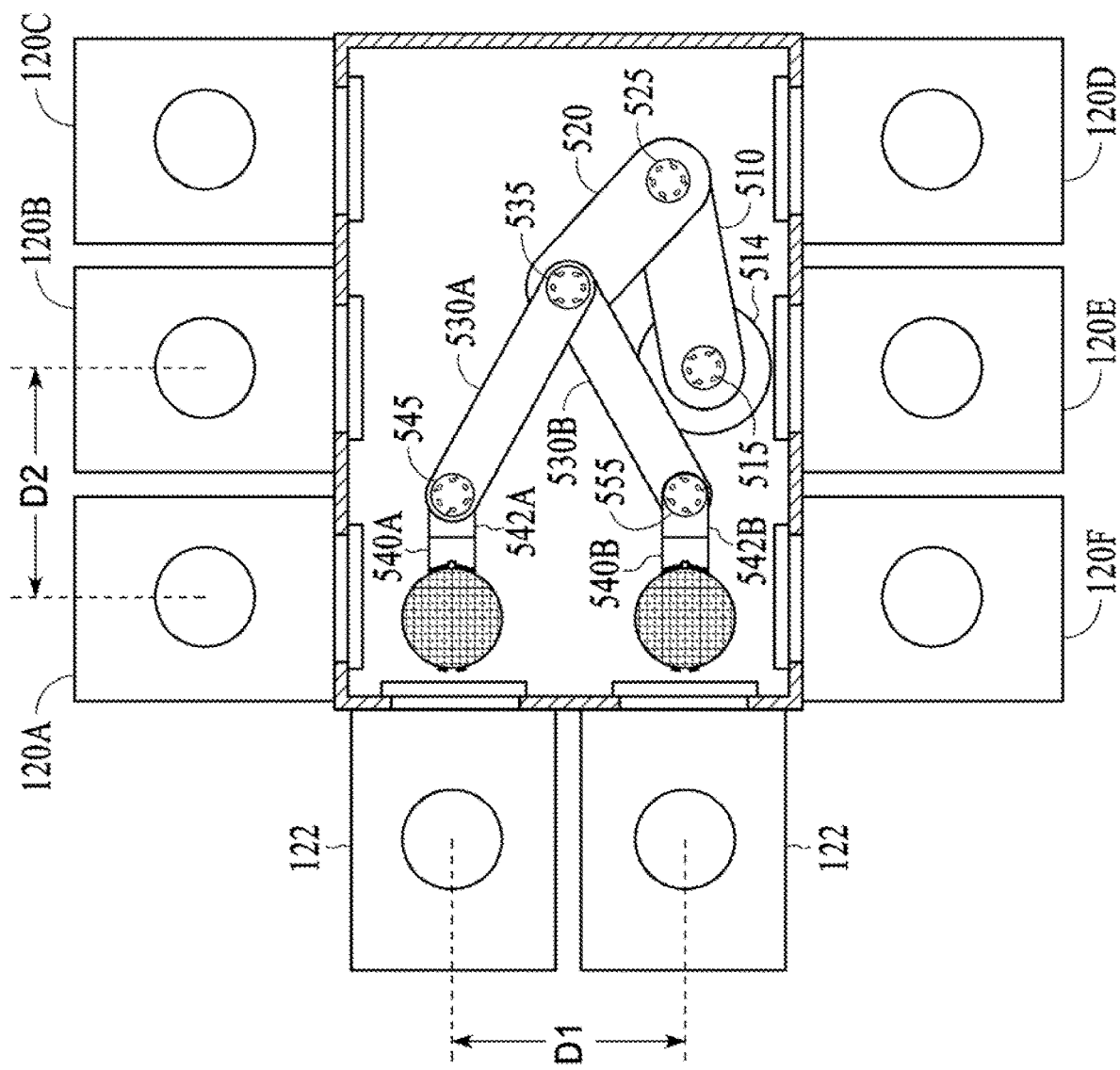

After processing, robot 102B may retrieve concurrently processed substrates from a pair of horizontally adjacent process chambers 120 in the "dual process chamber reach" configuration, swivel within transfer chamber 106, and arrive at a "loadlock preposition" alignment which may also be referred to as ""V" shape preposition" alignment, as shown in FIG. 6D. Swiveling may involve one or more of: rotating the lower arm 510 about first rotational axis 515; rotating upper arm 520 about second rotational axis 525; rotating one or more of the first forearm 530A or the second forearm 530B, independently, about the third rotational axis 535; rotating the first end effector 540A about fourth rotational axis 545; and/or rotating the second end effector about fifth rotational axis 555. Upon reaching the "loadlock preposition" alignment shown in FIG. 6D, robot apparatus 102B may repeat operations 6A through 6D cyclically to sequentially load and/or unload process chambers 120 and load lock chambers 122 in electronic device processing system 100.

The operation of robot apparatus 102B in a single substrate handling mode is further described with reference to FIGS. 7A-7D.

Figure 7A:
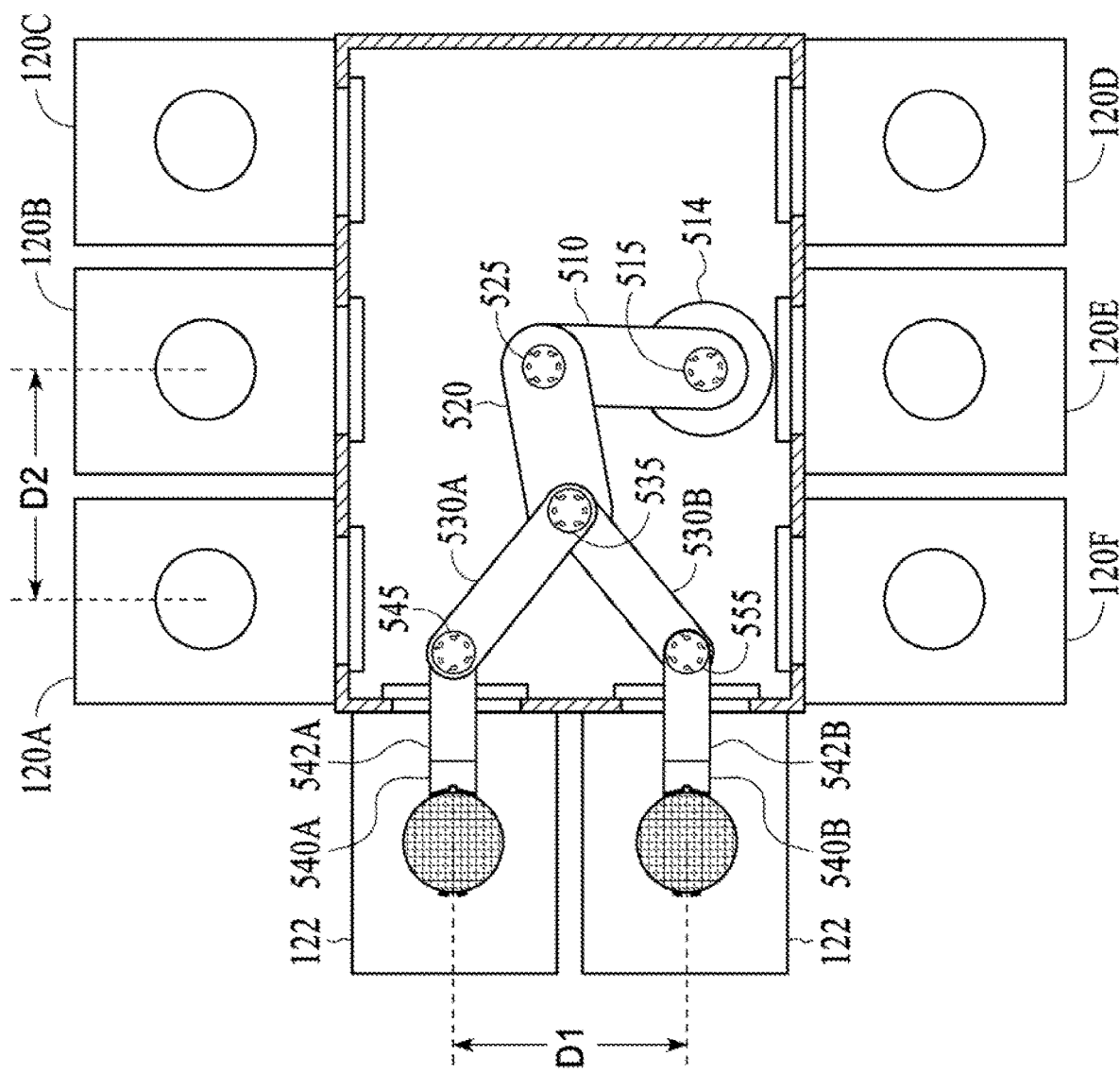
FIGS. 7A-7D illustrate schematics illustrative of the single substrate handling mode of the robot apparatus of FIGS. 5A-5B.

In FIG. 7A, robot apparatus 102B, is shown in the "dual load lock reach," as explained with respect to FIG. 6A. In the dual load lock reach, robot apparatus 102B can access both load lock chambers 122 to retrieve two substrates 118, which can then be concurrently placed in two horizontally adjacent process chambers 120 as shown with respect to FIGS. 6B-6C. Alternatively, the two substrates 118 may be sequentially unloaded into two process chambers (which may or may not be horizontally adjacent), as shown with respect to FIGS. 7B-7C.

Although not shown in the figures, robot apparatus 102B can also access one load lock chamber 122 to retrieve a single substrate 118 at a time. This may be useful to continue operation of the electronic device processing system when, for example, one load lock chamber is out of repair. For instance, end effector 540A could access either one of load lock chambers 122 without accessing the other. Similarly, end effector 540B could access either one of load lock chambers 122 without accessing the other. Doing so would involve independently rotating the first forearm 530A and the second forearm 530B independently rotate about the third rotational axis 535, the first end effector 540A independently rotates about the fourth rotational axis 545, and the second end effector 540B independently rotates about the fifth rotational axis 555, to align the first end effector 540A and the second end effector 540B in a configuration suitable for one of the first end effector 540A or the second end effector 540B to access one load lock chamber 122. In certain embodiments, slits valves 134 of load lock chambers 122 may have a width suitable for accommodating access of the first end effector 540A and/or the second end effector 540B, whether both are accessing two load lock chamber concurrently or one load lock chamber sequentially.

Figure 7B:
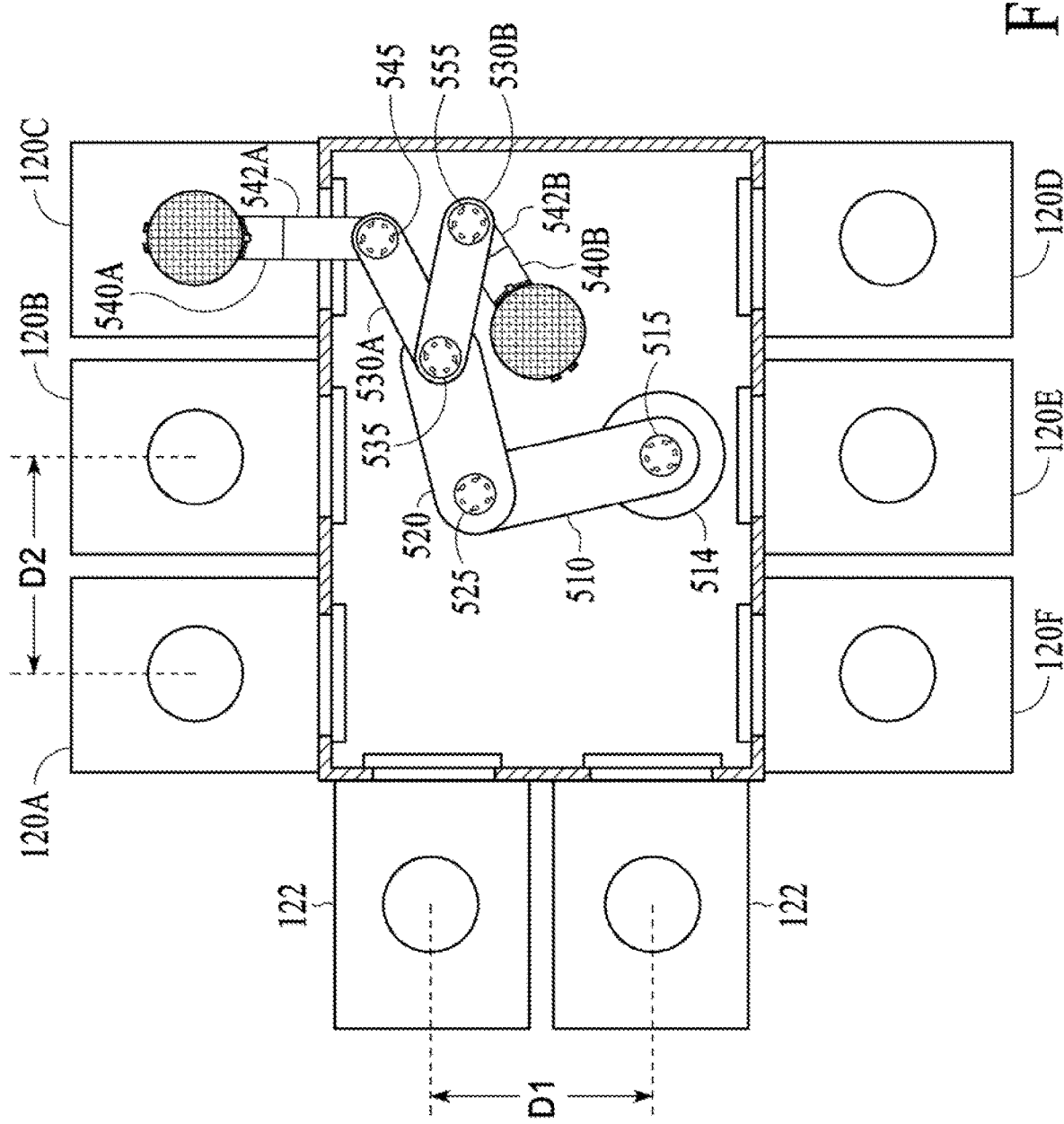
Figure 7C:
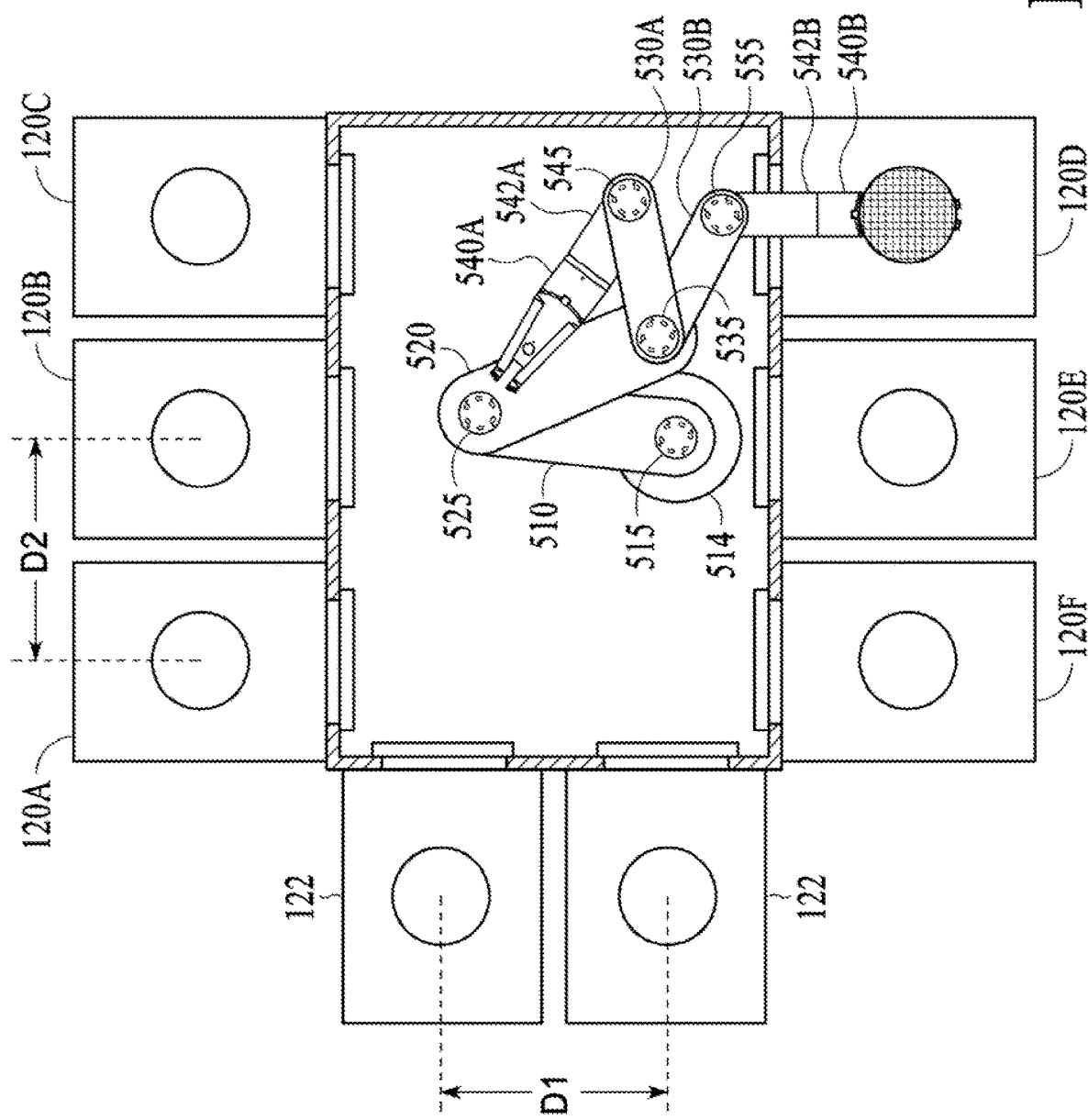

In FIGS. 7B and 7C, the first forearm 530A and the second forearm 530B independently rotate about the third rotational axis 535, the first end effector 540A independently rotates about the fourth rotational axis 545, and the second end effector 540B independently rotates about the fifth rotational axis 555, to align the first end effector 540A and the second end effector 540B in a configuration suitable for one of the first end effector 540A or the second end effector 540B to access one process chamber 120. For example, in FIG. 7B, first end effector 540A unloads a substrate into one process chamber and thereafter, in FIG. 7C, second end effector 540B unloads a substrate into another process chamber (positioned on the opposite side of the process chamber that received the substrate from first end effector 540A).

Figure 7D:
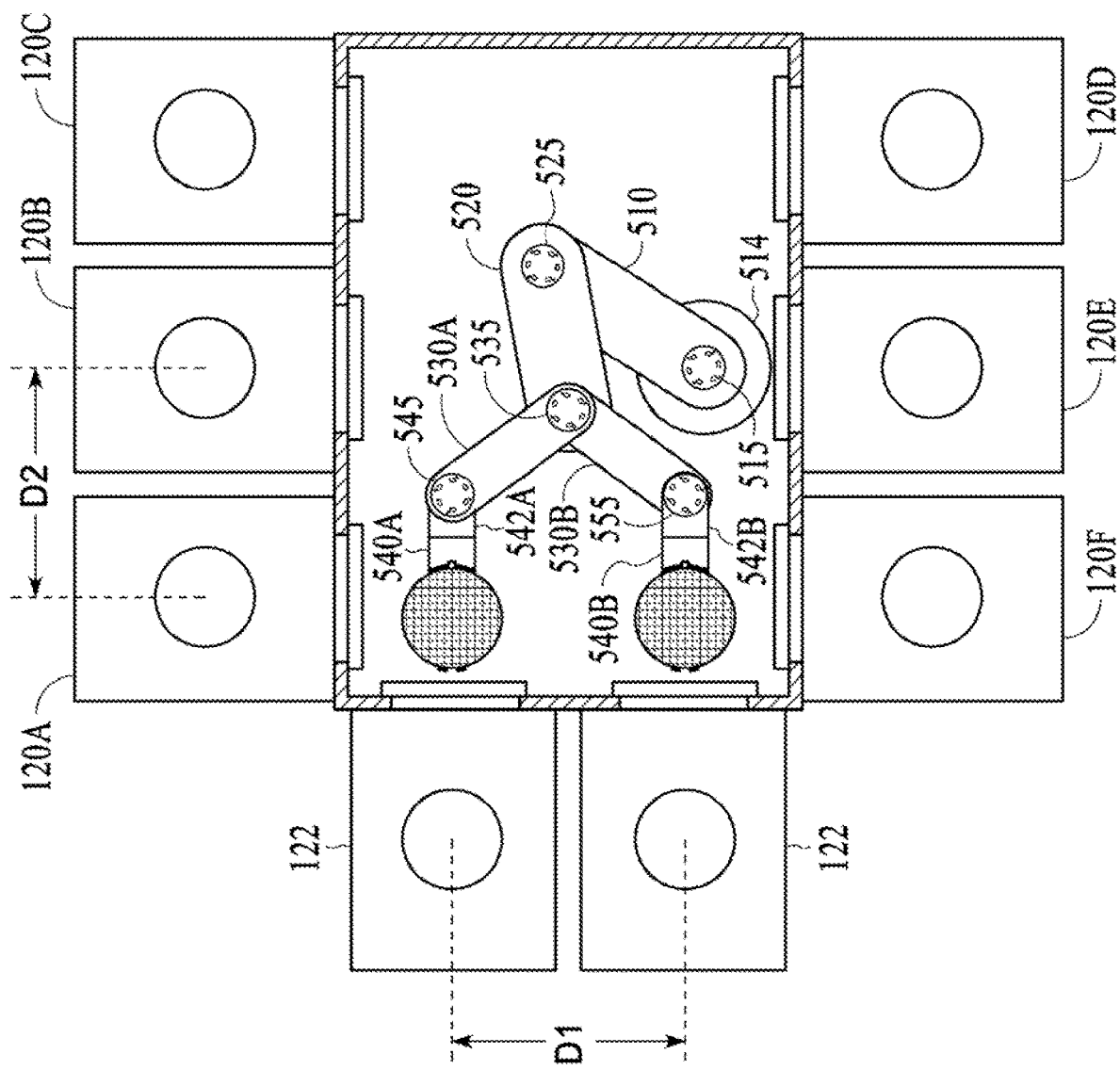

After processing, robot 102B may retrieve processed substrates sequentially with the "single process chamber reach" configurations shown in FIGS. 7B-7C, swivel within transfer chamber 106, and arrive at a "loadlock preposition" alignment which may also be referred to as ""V" shape preposition" alignment, as shown in FIG. 7D. Swiveling may involve one or more of: rotating the lower arm 510 about first rotational axis 515; rotating upper arm 520 about second rotational axis 525; rotating one or more of the first forearm 530A or the second forearm 530B, independently, about the third rotational axis 535; rotating the first end effector 540A about fourth rotational axis 545; and/or rotating the second end effector about fifth rotational axis 555. Upon reaching the "loadlock preposition" alignment or "V" shape preposition alignment shown in FIG. 7D, robot apparatus 102B may repeat operations 7A through 7D cyclically to sequentially load and/or unload process chambers 120 and load lock chambers 122 in electronic device processing system 100.

Robot apparatus 102B may also use a combination of dual substrate operation mode, in accordance with FIGS. 6A-6D, and single substrate operation mode, in accordance with FIGS. 7A-7D, to load and/or unload process chambers 120 and load lock chambers 122 in electronic device processing system 100.

For instance, in an electronic device processing system with six process chambers 120 (three on a first side and three on a second side that is opposite the first side), robot apparatus 102B may load substrates into the six process chambers in three runs, as follows: 1) dual substrate operation mode to concurrently load two substrates into one pair of horizontally adjacent process chambers on the first side (e.g., process chambers 120A and 120B); 2) dual substrate operation mode to concurrently load two substrates into one pair of horizontally adjacent process chambers on the second side (e.g., process chambers 120E and 120F); 3) single substrate operation mode to sequentially load one substrate into the remaining empty process chamber on the first side (e.g., process chamber 120C) followed by loading one substrate into the remaining empty process chamber on the second side (e.g., process chamber 120D). A similar sequence may be used to unload the same exemplary electronic device processing system. A similar sequence with more or fewer runs may also be implemented for other electronic device processing systems with more or fewer process chambers.

The sequence illustrated herein should not be construed as limiting. For instance, process chambers 120B and 120C may be loaded concurrently, process chambers 120D and 120E may be loaded concurrently, and process chambers 120A and 120F may be loaded sequentially. In another embodiment, process chambers 120A and 120B may be loaded concurrently, process chambers 120D and 120E may be loaded concurrently, and process chambers 120C and 120F may be loaded sequentially. In yet another embodiment, process chambers 120B and 120C may be loaded concurrently, process chambers 120E and 120F may be loaded concurrently, and process chambers 120A and 120D may be loaded sequentially. The order of loading and unloading the process chambers should also not be construed as limiting.

In another example, in an electronic device processing system with six process chambers 120 (three on a first side and three on a second side that is opposite the first side) with one operational load lock chamber (e.g., 122A), robot apparatus 102B may operate according to the following sequence: 1) single substrate operation mode to pick up one substrate from load lock chamber 122A with second end effector 540B; 2) single substrate operation mode to pick up a second substrate from load lock chamber 122A with first end effector 540A; 3) dual substrate operation mode to concurrently load two substrates into one pair of horizontally adjacent process chambers, or single substrate operation mode to sequentially load one substrate one process chamber followed by loading the second substrate into another process chamber; 4) repeating 1) through 3) until the electronic device processing system is fully loaded. A similar sequence may be used to unload the same exemplary electronic device processing system. A similar sequence with more or fewer runs may also be implemented for other electronic device processing systems with more or fewer process chambers. A similar sequence may also be used when the one operational load lock chamber is load lock chamber 122B.

Figure 8A:
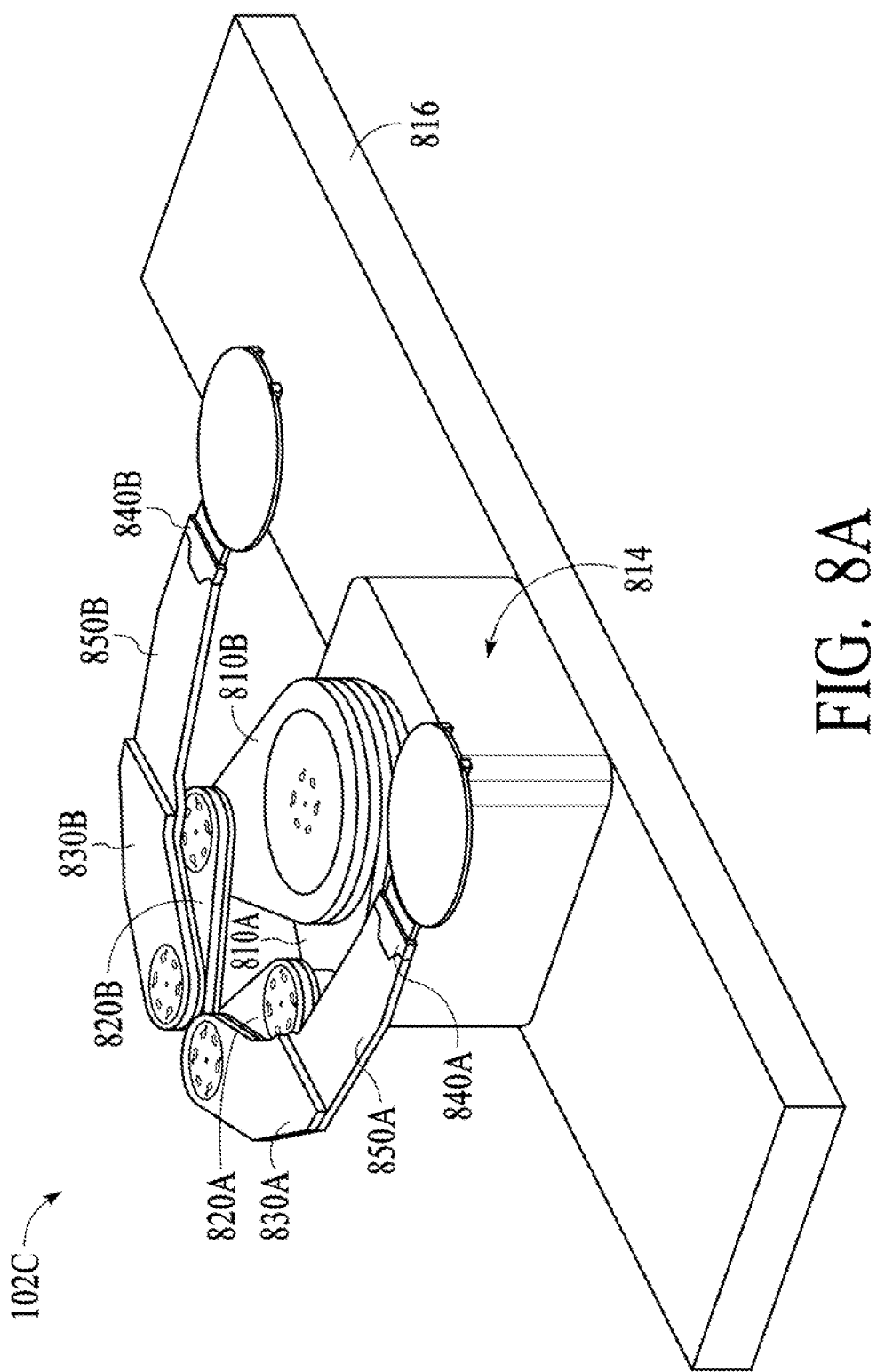
FIG. 8A illustrates a perspective view of a robot apparatus according to the disclosed embodiments.
Figure 8C:
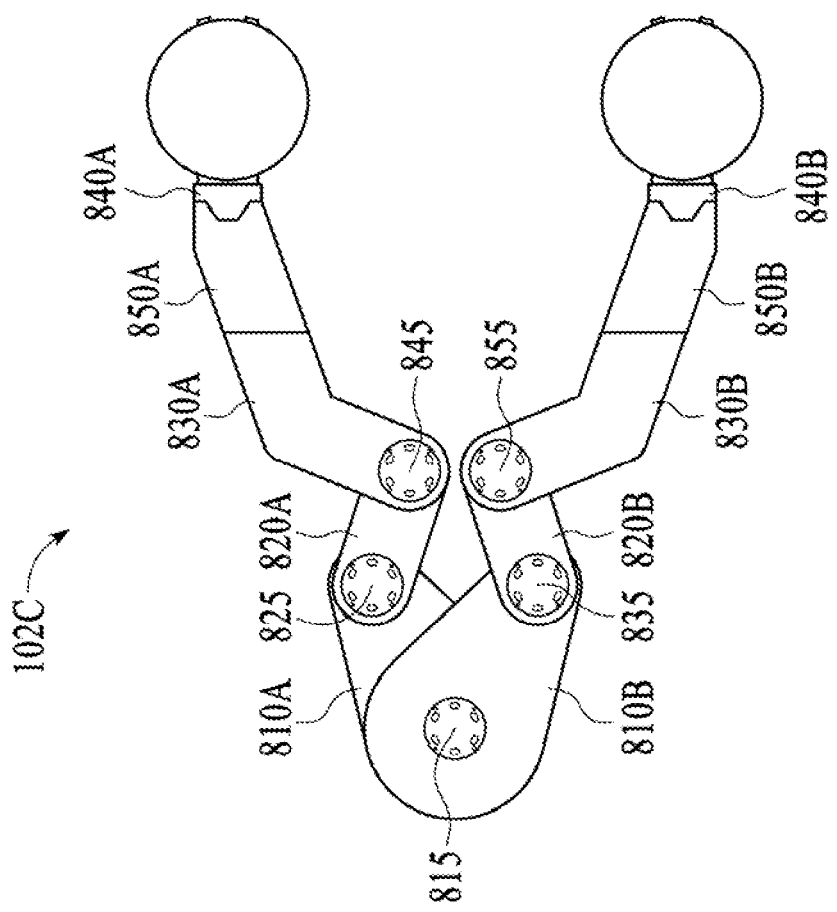
FIG. 8C illustrates a top view of the robot apparatus of FIG. 8A in an extended configuration (e.g., a twin chamber reach or a dual load lock reach in a dual substrate handling mode).
Figure 8B:
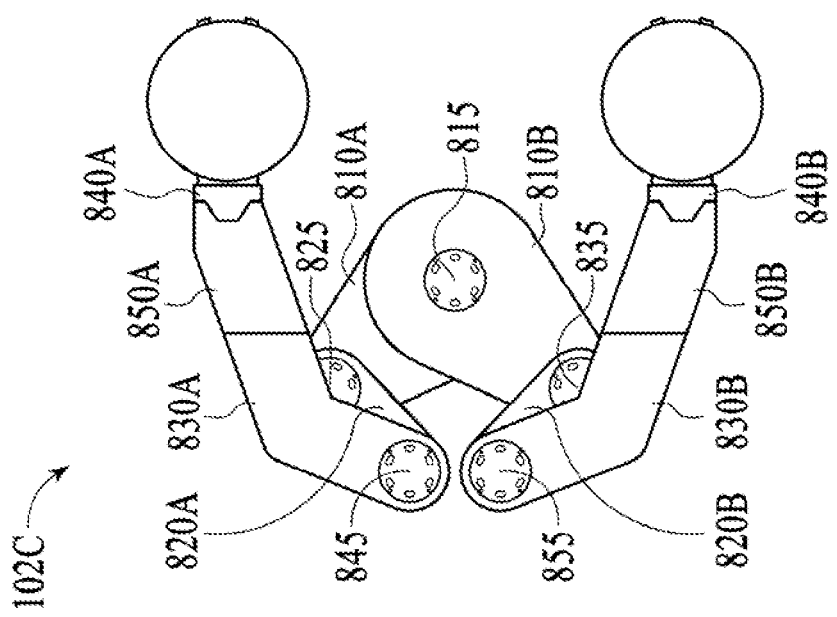
FIG. 8B illustrates a top view of the robot apparatus of FIG. 8A in a folded configuration (e.g., a chamber preposition or a load lock preposition).

Additional reference is made to FIG. 8A, which illustrates a perspective view of an embodiment of the robot apparatus 102 according to disclosed embodiments, to FIG. 8B which illustrates a top view of the robot apparatus 102 in a contracted (or folded) configuration according to disclosed embodiments, and to FIG. 8C which illustrates a top view of the robot apparatus 102 in an extended configuration according to disclosed embodiments. In the embodiment shown in FIGS. 8A-8C, robot apparatus 102C is illustrated. The robot apparatus 102C may include a body 814 mounted on a linear track 816. The body 814 may be configured to move along the linear track 816.

Robot apparatus 102C may further include a first lower arm 810A, configured to rotate about the first rotational axis 815, and a second lower arm 810B, configured to rotate about the first rotational axis 815. For example, one or more motors (not shown) located in the base 814 may independently rotate the first lower arm 810A and/or the second lower arm 810B about the first rotational axis 815.

The robot apparatus 102C may further include a first upper arm 820A rotatably coupled to the first lower arm 810A at a second rotational axis 825 that is spaced away from the first rotational axis 815. First upper arm 820A may be configured to rotate about the second rotational axis 825. For example, one or more motors (not shown) located in the base 814 may rotate the first upper arm 820A about the second rotational axis 825.

The robot apparatus 102C may further include a second upper arm 820B rotatably coupled to the second lower arm 810B at a sixth rotational axis 835 that is spaced away from the first rotational axis 815. Second upper arm 820B may be configured to rotate about the sixth rotational axis 835. For example, one or more motors (not shown) located in the base 814 may rotate the second upper arm 820B about the sixth rotational axis 835.

The robot apparatus 102C may further include a first forearm 830A rotatably coupled to the first upper arm 820A at a seventh rotational axis 845 spaced from the second rotational axis 825. The first forearm 830A may include a first bend in a first direction within a horizontal plane. The first forearm may be configured to independently rotate about the seventh rotational axis 845. For example, one or more motors (not shown) located in the base 814 may independently rotate the first forearm 830A about the seventh rotational axis 545 for both, the dual substrate handling mode and the single substrate handling mode.

The robot apparatus 102C may further include a second forearm 830B rotatably coupled to the second upper arm 820B at an eighth rotational axis 855 spaced from the sixth rotational axis 835. The second forearm 830B may include a second bend in a second direction within a horizontal plane, wherein the second direction is opposite the first direction. The second forearm may be configured to independently rotate about the eighth rotational axis 855. For example, one or more motors (not shown) located in the base 814 may independently rotate the second forearm 830B about the eighth rotational axis 855 for both, the dual substrate handling mode and the single substrate handling mode.

The robot apparatus 102C may further include a first end effector 840A that is coupled (optionally rotatably) to the first forearm 830A, optionally through a first wrist 850A. The robot apparatus 102C may also include a second end effector 840B that is coupled (optionally rotatably) to the second forearm 830B, optionally through a second wrist 850B.

In robot apparatus 102C, the first lower arm 810A, the second lower arm 810B, the first upper arm 820A, the second upper arm 820B, the first forearm 830A, the second forearm 830B, optionally the first wrist 850A, optionally the second wrist 850B, the first end effector 840A, and the second end effector 840B form together a "W" shape when the robot apparatus 102C is in a contracted (or folded) configuration as shown in FIG. 8B.

In robot apparatus 102C, the first lower arm 810A, the second lower arm 810B, the first upper arm 820A, the second upper arm 820B, the first forearm 830A, the second forearm 830B, optionally the first wrist 850A, optionally the second wrist 850B, the first end effector 840A, and the second end effector 840B form together a "V" shape when the robot apparatus 102C is in a an extended configuration, suitable for reaching into load lock chambers (e.g., load lock chambers 122) or into process chambers (e.g., process chambers 120) in a dual substrate operating mode, as shown in FIG. 8C.

In robot apparatus 102C, the first lower arm 810A, the second lower arm 810B, the first upper arm 820A, the second upper arm 820B, the first forearm 830A, the second forearm 830B, optionally the first wrist 850A, optionally the second wrist 850B, the first end effector 840A, and the second end effector 840B are configured to independently rotate about their corresponding rotational axis (e.g., about the first rotational axis 815, about the second rotational axis 825, about the sixth rotational axis 835, about the seventh rotational axis 845, about the eighth rotational axis 855, and/or about additional rotational axis (if any)) for both, the dual substrate handling mode and the single substrate handling mode.

For example, one or more motors (not shown) located in the base 814 may independently rotate the first lower arm 810A and the second lower arm 810B about the first rotational axis 815, the first upper arm 820A about the second rotational axis 825, the second upper arm 820B about the sixth rotational axis 835, the first forearm 830A about the seventh rotational axis 845, and the second forearm 830B about the eighth rotational axis 855 for both, the dual substrate handling mode and the single substrate handling mode.

During operation, robot apparatus 102C may move along linear track 816 to access various process chambers 920 or load lock chambers 922. Similarly, robot apparatus 102C may operate in single substrate handling mode, dual substrate handling mode, or a combination thereof to load and/or unload process chambers 920 and load lock chambers 922 in electronic device processing system 900, shown in FIG. 9.

For robot apparatus 102C, operating in dual substrate handling mode includes independently rotating the first lower arm 810A, the second lower arm 810B, the first upper arm 820A, the second upper arm 820B, the first forearm 830A, the second forearm 830B, optionally the first wrist 850A, optionally the second wrist 850B, the first end effector 840A, and the second end effector 840B, about the first rotational axis 815, the second rotational axis 825, the sixth rotational axis 835, the seventh rotational axis 845, and the eighth rotational axis 855 to space the first end effector 850A from the second effector 850B by the first pitch D91 or by the second pitch D92.

As can be seen in FIG. 9, in some embodiments, the first pitch D91 is measured between a first end point 942A of the first end effector 940A and a second end point 942B of the second end effector 940B, as shown in the FIG. 9 configuration, and said first pitch D91 corresponds to the distance between the centers of two horizontally adjacent load lock chambers 922. In some embodiments, the first pitch D91 between centers of the two adjacent load lock chambers 922 may be in a range of about 20 inches to about 25 inches. In some embodiments, the first pitch D91 between centers of two adjacent load lock chambers 922 may be in a range of about 21 inches to about 23 inches. In some embodiments, the first pitch D91 between centers of two adjacent load lock chambers 922 may be about 22 inches. Other distances for the first pitch D91 may also be possible.

As can be seen in FIG. 9, in some embodiments, the second pitch D92 is measured between a first end point 942A of the first end effector 940A and a second end point 942B of the second end effector 940B, as shown in the FIG. 9 configuration, and said second pitch D92 corresponds to the distance between the centers of two horizontally adjacent load lock chambers 922. In some embodiments, the second pitch D92 between centers of the two adjacent load lock chambers 922 may be in a range of about 20 inches to about 25 inches. In some embodiments, the second pitch D92 between centers of two adjacent load lock chambers 922 may be in a range of about 21 inches to about 23 inches. In some embodiments, the second pitch D92 between centers of two adjacent load lock chambers 922 may be about 22 inches. Other distances for the second pitch D91 may also be possible.

For robot apparatus 102C, operating in single substrate handling mode includes independently rotating the first lower arm 810A, the second lower arm 810B, the first upper arm 820A, the second upper arm 820B, the first forearm 830A, the second forearm 830B, optionally the first wrist 850A, optionally the second wrist 850B, the first end effector 840A, and the second end effector 840B, about the first rotational axis 815, the second rotational axis 825, the sixth rotational axis 835, the seventh rotational axis 845, and the eighth rotational axis 855 to align the first end effector 840A and the second end effector 840B in a configuration suitable for one of the first end effector 840A or the second end effector 840B to access one load lock chamber 922 or one process chamber 920.

The foregoing description discloses example embodiments of the disclosure. Modifications of the above-disclosed apparatus, systems, and methods which fall within the scope of the disclosure will be readily apparent to those of ordinary skill in the art. Accordingly, while the present disclosure has been disclosed in connection with example embodiments, it should be understood that other embodiments may fall within the scope of the disclosure, as defined by the claims.

What is claimed is:

1. A robot apparatus, comprising:
   at least one lower arm configured to rotate about a first rotational axis;
   at least one upper arm rotatably coupled to the at least one lower arm at a second rotational axis that is spaced away from the first rotational axis;
   a first end effector rotatably coupled to the at least one upper arm optionally through a first forearm; and
   a second end effector rotatably coupled to the at least one upper arm optionally through a second forearm, wherein the first end effector and the second end effector are co-planar;
   wherein the robot apparatus is configured to operate both in a dual substrate handling mode and in a single substrate handling mode,
   wherein, in the dual substrate handling mode, the first end effector and the second end effector are to independently rotate about one or more additional rotational axis that are different from the first rotational axis and from the second rotational axis to space the first end effector from the second end effector by a first pitch or by a second pitch that is different from the first pitch, wherein at least one of the first pitch or the second pitch is suitable for the first end effector and the second end effector to concurrently access separate load lock chambers or separate process chambers, and
   wherein, in the single substrate handling mode, the first end effector and the second end effector are to independently rotate about the one or more additional rotational axis to align the first end effector and the second end effector at a configuration suitable for one of the first end effector or the second end effector to access one load lock chamber or one process chamber.

2. The robot apparatus of claim 1, further comprising a body mounted on a linear track, wherein the body is configured to move along the linear track, wherein the at least one lower arm and the at least one upper arm are coupled to the body, and wherein:
   the at least one lower arm comprises:
   a first lower arm configured to rotate about a first rotational axis; and
   a second lower arm configured to rotate about the first rotational axis;
   the at least one upper arm comprises:
   a first upper arm rotatably coupled to the first lower arm at the second rotational axis that is spaced away from the first rotational axis; and a second upper arm rotatably coupled to the second lower arm at a sixth rotational axis that is spaced away from the first rotational axis;
a first forearm rotatably coupled to the first upper arm at a seventh rotational axis, wherein the first forearm comprises a first bend in a first direction within a horizontal plane;
a second forearm rotatably coupled to the second upper arm at an eighth rotational axis, wherein the second forearm comprises a second bend in a second direction within the horizontal plane, wherein the second direction is opposite the first direction;
a first end effector coupled to the first forearm, optionally through a first wrist; and
a second end effector coupled to the second forearm, optionally through a second wrist,
wherein the first lower arm, the second lower arm, the first upper arm, the second upper arm, the first forearm, the second forearm, optionally the first wrist, optionally the second wrist, the first end effector, and the second end effector form together a "W" shape, and are configured to independently rotate about the first rotational axis, the sixth rotational axis, the seventh rotational axis, and the eighth rotational axis for both, the dual substrate handling mode and the single substrate handling mode.

3. The robot apparatus of claim 1, wherein the first pitch is in a range of about 20 inches to about 25 inches, and wherein the second pitch is in a range of about 32 inches to about 40 inches.

4. The robot apparatus of claim 1, wherein the first pitch is about 22 inches, and wherein the second pitch is about 36 inches.

5. The robot apparatus of claim 1, wherein:
the at least one lower arm comprises one lower arm configured to rotate about the first rotational axis;
the at least one upper arm comprises one upper arm rotatably coupled to the one lower arm at the second rotational axis that is spaced away from the first rotational axis;
the first end effector is rotatably coupled to the one upper arm at a third rotational axis, wherein the first end effector comprises a first bend in a first direction within a horizontal plane; and
the second end effector is rotatably coupled to the one upper arm at the third rotational axis, wherein the second end effector comprises a second bend in a second direction within the horizontal plane, wherein the second direction is opposite the first direction,
wherein the first end effector and the second end effector are configured to rotate independently about the third rotational axis for both, the dual substrate handling mode and the single substrate handling mode.

6. The robot apparatus of claim 1, wherein:
the at least one lower arm comprises one lower arm configured to rotate about the first rotational axis;
the at least one upper arm comprises one upper arm rotatably coupled to the one lower arm at the second rotational axis that is spaced away from the first rotational axis;
a first forearm and a second forearm, each rotatably coupled to the one upper arm at a third rotational axis;
the first end effector rotatably coupled to the first forearm at a fourth rotational axis;
the second end effector rotatably coupled to the second forearm at a fifth rotational axis; and wherein the first forearm, the second forearm, the first end effector, and the second end effector, are configured to rotate independently about the third rotational axis, the fourth rotational axis, and the fifth rotational axis for both, the dual substrate handling mode and the single substrate handling mode.

7. An electronic device processing system, comprising:
a transfer chamber;
two adjacent load lock chambers coupled to the transfer chamber, wherein the two adjacent load lock chambers are horizontally spaced by a first pitch;
four or more process chambers coupled to the transfer chamber, wherein at least one pair of adjacent process chambers of the four or more process chambers are spaced by a second pitch that is different from the first pitch; and
a robot apparatus at least partially located within the transfer chamber, the robot apparatus comprising:
at least one lower arm configured to rotate about a first rotational axis;
at least one upper arm rotatably coupled to the at least one lower arm at a second rotational axis that is spaced away from the first rotational axis;
a first end effector rotatably coupled to the at least one upper arm optionally through a first forearm; and
a second end effector rotatably coupled to the at least one upper arm optionally through a second forearm, wherein the first end effector and the second end effector are co-planar;
wherein the robot apparatus is configured to operate both in a dual substrate handling mode and in a single substrate handling mode,
wherein, in the dual substrate handling mode, the first end effector and the second end effector are to independently rotate about one or more additional rotational axis that are different from the first rotational axis and from the second rotational axis to space the first end effector from the second end effector by the first pitch or by the second pitch that is different from the first pitch to enable the first end effector and the second end effector to concurrently access the two adjacent load lock chambers or the at least one pair of adjacent process chambers, and
wherein, in the single substrate handling mode, the first end effector and the second end effector are to independently rotate about the one or more additional rotational axis to align the first end effector and the second end effector at a configuration suitable for one of the first end effector or the second end effector to access one load lock chamber or one process chamber.

8. The electronic device processing system of claim 7, wherein the robot apparatus further comprises a body mounted on a linear track, wherein the body is configured to move along the linear track, wherein the at least one lower arm and the at least one upper arm are coupled to the body, and wherein, in the robot apparatus:
the at least one lower arm comprises:
a first lower arm configured to rotate about a first rotational axis; and
a second lower arm configured to rotate about the first rotational axis;
the at least one upper arm comprises:
a first upper arm rotatably coupled to the first lower arm at the second rotational axis that is spaced away from the first rotational axis; and a second upper arm rotatably coupled to the second lower arm at a sixth rotational axis that is spaced away from the first rotational axis;
a first forearm rotatably coupled to the first upper arm at a seventh rotational axis, wherein the first forearm comprises a first bend in a first direction within a horizontal plane;
a second forearm rotatably coupled to the second upper arm at an eighth rotational axis, wherein the second forearm comprises a second bend in a second direction within the horizontal plane, wherein the second direction is opposite the first direction;
a first end effector coupled to the first forearm, optionally through a first wrist; and
a second end effector coupled to the second forearm, optionally through a second wrist,
wherein the first lower arm, the second lower arm, the first upper arm, the second upper arm, the first forearm, the second forearm, optionally the first wrist, optionally the second wrist, the first end effector, and the second end effector form together a "W" shape, and are configured to independently rotate about the first rotational axis, the second rotational axis, the sixth rotational axis, the seventh rotational axis, and the eighth rotational axis for both, the dual substrate handling mode and the single substrate handling mode.

9. The electronic device processing system of claim 7, comprising from 4 to 24 process chambers.

10. The electronic device processing system of claim 7, wherein the first pitch is in a range of about 20 inches to about 25 inches, and wherein the second pitch is in a range of about 32 inches to about 40 inches.

11. The electronic device processing system of claim 7, wherein, in the robot apparatus:
the at least one lower arm comprises one lower arm configured to rotate about the first rotational axis;
the at least one upper arm comprises one upper arm rotatably coupled to the one lower arm at the second rotational axis that is spaced away from the first rotational axis;
the first end effector is rotatably coupled to the one upper arm at a third rotational axis, wherein the first end effector comprises a first bend in a first direction within a horizontal plane; and
the second end effector is rotatably coupled to the one upper arm at the third rotational axis, wherein the second end effector comprises a second bend in a second direction within the horizontal plane, wherein the second direction is opposite the first direction,
wherein the first end effector and the second end effector are configured to rotate independently about the third rotational axis for both, the dual substrate handling mode and the single substrate handling mode.

12. The electronic device processing system of claim 7, wherein, in the robot apparatus:
the at least one lower arm comprises one lower arm configured to rotate about the first rotational axis;
the at least one upper arm comprises one upper arm rotatably coupled to the one lower arm at the second rotational axis that is spaced away from the first rotational axis;
a first forearm and a second forearm, each rotatably coupled to the one upper arm at a third rotational axis;
the first end effector rotatably coupled to the first forearm at a fourth rotational axis;
the second end effector rotatably coupled to the second forearm at a fifth rotational axis;

wherein the first forearm, the second forearm, the first end effector, and the second end effector, are configured to rotate independently about the third rotational axis, the fourth rotational axis, and the fifth rotational axis for both, the dual substrate handling mode and the single substrate handling mode.

13. A method of transferring substrates, comprising operating a robot apparatus in a dual substrate handling mode and in a single substrate handling mode,
wherein the robot apparatus comprises:
at least one lower arm configured to rotate about a first rotational axis;
at least one upper arm rotatably coupled to the at least one lower arm at a second rotational axis that is spaced away from the first rotational axis;
a first end effector rotatably coupled to the at least one upper arm optionally through a first forearm; and
a second end effector rotatably coupled to the at least one upper arm optionally through a second forearm, wherein the first end effector and the second end effector are co-planar;
wherein operating in a dual substrate handling mode comprises:
independently rotating the first end effector and the second end effector, about one or more additional rotational axis that are different from the first rotational axis and from the second rotational axis, to space the first end effector from the second end effector by a first pitch or by a second pitch that is different from the first pitch, wherein at least one of the first pitch or the second pitch is suitable for the first end effector and the second end effector to concurrently access separate load lock chambers or separate process chambers; and
wherein operating in a single substrate handling mode comprises:
independently rotating the first end effector and the second end effector, about the one or more additional rotational axis, to align the first end effector and the second end effector in a configuration suitable for one of the first end effector or the second end effector to access one load lock chamber or one process chamber.

14. The method of claim 13, wherein, in the robot apparatus:
the at least one lower arm comprises one lower arm configured to rotate about the first rotational axis;
the at least one upper arm comprises one upper arm rotatably coupled to the one lower arm at the second rotational axis that is spaced away from the first rotational axis;
a first forearm and a second forearm, each rotatably coupled to the one upper arm at a third rotational axis;
the first end effector rotatably coupled to the first forearm at a fourth rotational axis;
the second end effector rotatably coupled to the second forearm at a fifth rotational axis;
wherein operating in the dual substrate handling mode comprises:
independently rotating the first forearm, the second forearm, the first end effector, and the second end effector, about the third rotational axis, the fourth rotational axis, and the fifth rotational axis to space the first end effector from the second end effector by the first pitch or by the second pitch; and
wherein operating in the single substrate handling mode comprises:

independently rotating the first forearm, the second forearm, the first end effector, and the second end effector, about the third rotational axis, the fourth rotational axis, and the fifth rotational axis to align the first end effector and the second end effector in a configuration suitable for one of the first end effector or the second end effector to access one load lock chamber or one process chamber.

15. The method of claim 13, wherein the robot apparatus further comprises a body mounted on a linear track, wherein the body is configured to move along the linear track, wherein the at least one lower arm and the at least one upper arm are coupled to the body, and wherein, in the robot apparatus:
the at least one lower arm comprises:
a first lower arm configured to rotate about a first rotational axis; and
a second lower arm configured to rotate about the first rotational axis;
the at least one upper arm comprises:
a first upper arm rotatably coupled to the first lower arm at the second rotational axis that is spaced away from the first rotational axis; and
a second upper arm rotatably coupled to the second lower arm at a sixth rotational axis that is spaced away from the first rotational axis;
a first forearm rotatably coupled to the first upper arm at a seventh rotational axis, wherein the first forearm comprises a first bend in a first direction within a horizontal plane;
a second forearm rotatably coupled to the second upper arm at an eighth rotational axis, wherein the second forearm comprises a second bend in a second direction within the horizontal plane, wherein the second direction is opposite the first direction;
a first end effector coupled to the first forearm, optionally through a first wrist; and
a second end effector coupled to the second forearm, optionally through a second wrist,
wherein operating in the dual substrate handling mode comprises:
independently rotating the first lower arm, the second lower arm, the first upper arm, the second upper arm, the first forearm, the second forearm, optionally the first wrist, optionally the second wrist, the first end effector, and the second end effector, about the first rotational axis, the second rotational axis, the sixth rotational axis, the seventh rotational axis, and the eighth rotational axis to space the first end effector from the second end effector by the first pitch or by the second pitch; and
wherein operating in the single substrate handling mode comprises:
independently rotating the first lower arm, the second lower arm, the first upper arm, the second upper arm, the first forearm, the second forearm, optionally the first wrist, optionally the second wrist, the first end effector, and the second end effector, about the first rotational axis, the second rotational axis, the sixth rotational axis, the seventh rotational axis, and the eighth rotational axis to align the first end effector and the second end effector in a configuration suitable for one of the first end effector or the second end effector to access one load lock chamber or one process chamber.

16. The method of claim 13, wherein the first pitch is in a range of about 20 inches to about 25 inches, and wherein the second pitch is in a range of about 32 inches to about 40 inches.

17. The method of claim 13, wherein, in the robot apparatus:
the at least one lower arm comprises one lower arm configured to rotate about the first rotational axis;
the at least one upper arm comprises one upper arm rotatably coupled to the one lower arm at the second rotational axis that is spaced away from the first rotational axis;
the first end effector is rotatably coupled to the one upper arm at a third rotational axis, wherein the first end effector comprises a first bend in a first direction within a horizontal plane; and
the second end effector is rotatably coupled to the one upper arm at the third rotational axis, wherein the second end effector comprises a second bend in a second direction within the horizontal plane, wherein the second direction is opposite the first direction,
wherein operating in the dual substrate handling mode comprises:
independently rotating the first end effector and the second end effector, about the third rotational axis, to space the first end effector from the second end effector by the first pitch or by the second pitch; and
wherein operating in the single substrate handling mode comprises:
independently rotating the first end effector and the second end effector, about the third rotational axis, to align the first end effector and the second end effector in a configuration suitable for one of the first end effector or the second end effector to access one load lock chamber or one process chamber.

18. An electronic device processing system, comprising:
a transfer chamber with a center;
two adjacent load lock chambers coupled to the transfer chamber, wherein the two adjacent load lock chambers are horizontally spaced by a first pitch;
four or more process chambers coupled to the transfer chamber, wherein at least one pair of adjacent process chambers of the four or more process chambers are spaced by a second pitch that is different from the first pitch; and
a robot apparatus at least partially located within the transfer chamber, the robot apparatus comprising:
at least one lower arm configured to rotate about a first rotational axis, wherein the first rotational axis is offset from the center of the transfer chamber;
at least one upper arm rotatably coupled to the at least one lower arm at a second rotational axis that is spaced away from the first rotational axis;
a first end effector rotatably coupled to the at least one upper arm optionally through a first forearm; and
a second end effector rotatably coupled to the at least one upper arm optionally through a second forearm, wherein the first end effector and the second end effector are co-planar;
wherein the robot apparatus is configured to operate in a dual substrate handling mode,
wherein, in the dual substrate handling mode, the first end effector and the second end effector are to independently rotate about one or more additional rotational axis that are different from the first rotational axis and from the second rotational axis to space the first end effector from the second end effector by the first pitch or by the second pitch that is different from the first pitch to enable the first end effector and the second end effector to concurrently access the two adjacent load lock chambers or the at least one pair of adjacent process chambers.

\* \* \* \* \*